United States Patent
Bishop et al.

(10) Patent No.: US 10,157,803 B2
(45) Date of Patent: Dec. 18, 2018

(54) SEMICONDUCTOR DEVICE AND METHOD OF UNIT SPECIFIC PROGRESSIVE ALIGNMENT

(71) Applicant: DECA Technologies Inc., Tempe, AZ (US)

(72) Inventors: Craig Bishop, Tempe, AZ (US); Christopher M. Scanlan, Chandler, AZ (US)

(73) Assignee: DECA Technologies Inc., Tempe, AZ (US)

( * ) Notice: Subject to any disclaimer, the term of this patent is extended or adjusted under 35 U.S.C. 154(b) by 0 days.

(21) Appl. No.: 15/706,647

(22) Filed: Sep. 15, 2017

(65) Prior Publication Data

US 2018/0082911 A1    Mar. 22, 2018

Related U.S. Application Data

(60) Provisional application No. 62/396,483, filed on Sep. 19, 2016.

(51) Int. Cl.
  *H01L 21/66* (2006.01)
  *H01L 21/31* (2006.01)

(52) U.S. Cl.
  CPC .............. *H01L 22/20* (2013.01); *H01L 21/31* (2013.01)

(58) Field of Classification Search
  CPC ..... H01L 21/56; H01L 21/561; H01L 21/568; H01L 21/768; H01L 21/66
  See application file for complete search history.

(56) References Cited

U.S. PATENT DOCUMENTS

| | | |
|---|---|---|
| 5,359,496 A | 10/1994 | Kornrumpf et al. |
| 5,465,217 A | 11/1995 | Yip et al. |
| 6,249,047 B1 | 6/2001 | Corisis |
| 6,392,301 B1 | 5/2002 | Waizman et al. |
| 6,404,643 B1 | 6/2002 | Chung |
| 6,433,419 B2 | 8/2002 | Khandros et al. |
| 6,655,011 B1 | 12/2003 | Kornrumpf et al. |
| 6,836,023 B2 | 12/2004 | Joshi et al. |
| 6,851,100 B1 | 2/2005 | You et al. |
| 7,078,272 B2 | 7/2006 | Ho et al. |

(Continued)

FOREIGN PATENT DOCUMENTS

| | | |
|---|---|---|
| CN | 102549732 A | 3/2016 |
| RU | 2183882 C2 | 6/2002 |

(Continued)

*Primary Examiner* — Changhyun Yi
(74) *Attorney, Agent, or Firm* — Booth Udall Fuller, PLC

(57) ABSTRACT

A semiconductor device and method can comprise measuring a true position of each of a plurality of semiconductor die within an embedded die panel and determining a total radial shift of each of the plurality of semiconductor die. The total radial shift of each of the plurality of semiconductor die can be distributed to two or more layers for each of the plurality of semiconductor die by assigning a portion of the total radial shift to each of the layers according to a priority list to form a distributed radial shift for each of the layers. A transformation for each of the layers for each of the plurality of semiconductor die can be transformed using the distributed radial shift for each of the layers. A unit specific pattern can be formed over each of the plurality of semiconductor die with the transformation for each of the layers.

16 Claims, 10 Drawing Sheets

(56) References Cited

U.S. PATENT DOCUMENTS

| | | |
|---|---|---|
| 7,514,273 B2 | 4/2009 | Hedler et al. |
| 7,659,622 B2 | 2/2010 | Dauksher et al. |
| 7,707,713 B2 | 5/2010 | Akagawa et al. |
| 7,725,862 B2 | 5/2010 | Hummler |
| 7,772,696 B2 | 8/2010 | Hunter |
| 7,793,412 B2 | 9/2010 | Akagawa et al. |
| 7,843,052 B1 | 11/2010 | Yoo et al. |
| 7,928,563 B2 | 4/2011 | Bakir et al. |
| 7,979,813 B2 | 7/2011 | Rumsey et al. |
| 8,004,095 B2 | 8/2011 | Shim et al. |
| 8,053,279 B2 | 11/2011 | Farnworth et al. |
| 8,084,871 B2 | 12/2011 | Rahim et al. |
| 8,822,268 B1 | 9/2014 | Magnus |
| 9,040,316 B1 | 5/2015 | Scanlan et al. |
| 2001/0020735 A1 | 9/2001 | Chikawa et al. |
| 2002/0011663 A1 | 1/2002 | Khandros et al. |
| 2003/0066040 A1 | 4/2003 | Morgan |
| 2003/0090006 A1 | 5/2003 | Farnworth |
| 2003/0124868 A1 | 7/2003 | Mizukoshi |
| 2004/0032013 A1 | 2/2004 | Cobbley et al. |
| 2004/0049912 A1 | 10/2004 | Akagawa et al. |
| 2005/0248022 A1 | 11/2005 | Badr et al. |
| 2006/0168552 A1 | 7/2006 | Farnworth et al. |
| 2007/0249067 A1 | 10/2007 | Hedler et al. |
| 2008/0136004 A1 | 6/2008 | Yang et al. |
| 2008/0178127 A1 | 7/2008 | Dewkett et al. |
| 2008/0230889 A1 | 9/2008 | Standing |
| 2008/0237828 A1 | 10/2008 | Yang |
| 2008/0288908 A1 | 11/2008 | Hart et al. |
| 2009/0057888 A1 | 3/2009 | Hunter |
| 2010/0180249 A1 | 7/2010 | Rumsey et al. |
| 2010/0203676 A1 | 8/2010 | Theuss et al. |
| 2010/0230795 A1 | 9/2010 | Kriman et al. |
| 2010/0301474 A1 | 12/2010 | Yang |
| 2011/0074041 A1 | 3/2011 | Leung |
| 2011/0108981 A1 | 5/2011 | Rahim et al. |
| 2011/0154277 A1 | 6/2011 | Ankenbauer et al. |
| 2011/0202896 A1 | 8/2011 | Scanlan et al. |
| 2011/0217814 A1 | 9/2011 | Gao |
| 2012/0329212 A1 | 12/2012 | Leal |
| 2013/0113091 A1 | 5/2013 | Meng et al. |
| 2013/0168849 A1 | 7/2013 | Scanlan |
| 2013/0249088 A1 | 9/2013 | Scanlan et al. |
| 2013/0280826 A1* | 10/2013 | Scanlan ................. H01L 23/544 438/15 |
| 2015/0270239 A1 | 9/2015 | Yang |
| 2016/0276258 A1 | 9/2016 | Lin |
| 2016/0322343 A1 | 11/2016 | Scanlan |
| 2016/0329257 A1 | 11/2016 | Scanlan |
| 2017/0033009 A1 | 2/2017 | Scanlan |

FOREIGN PATENT DOCUMENTS

| | | |
|---|---|---|
| WO | 2009006284 | 1/2009 |
| WO | 2009009436 | 1/2009 |

* cited by examiner

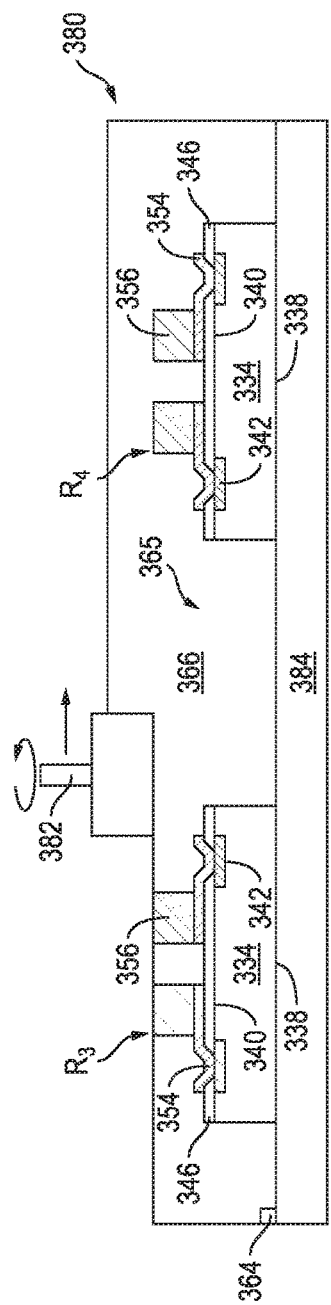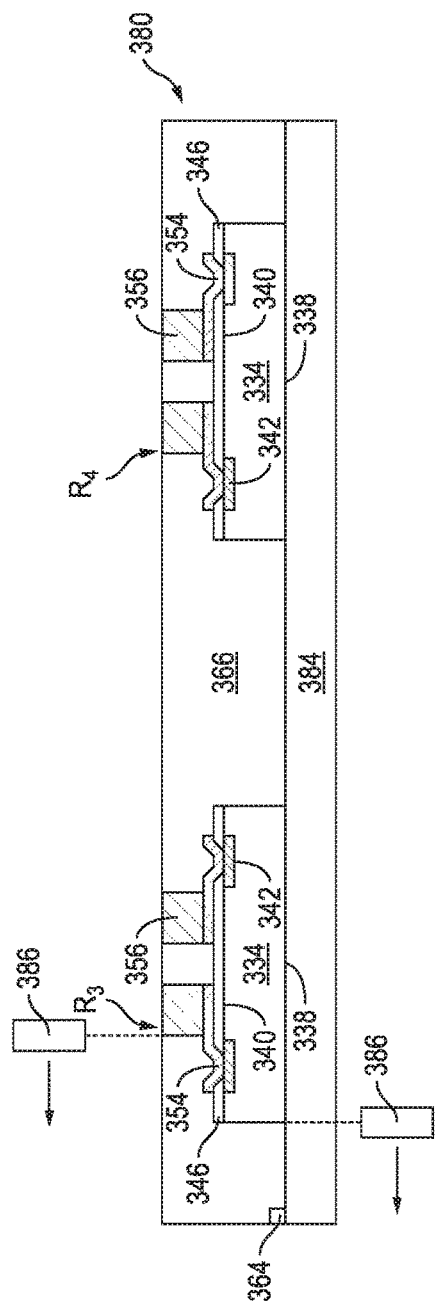

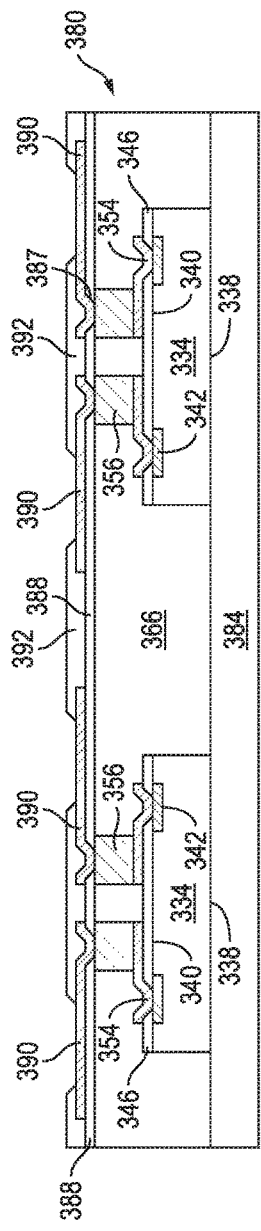
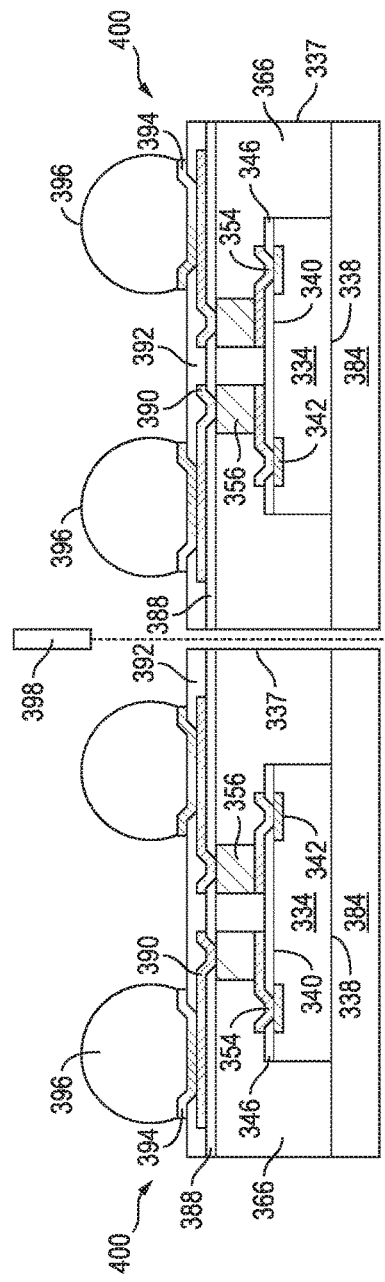

SEMICONDUCTOR DEVICE AND METHOD OF UNIT SPECIFIC PROGRESSIVE ALIGNMENT

CROSS-REFERENCE TO RELATED APPLICATIONS

This application claims the benefit, including the filing date, of U.S. Provisional Patent No. 62/396,483, entitled "Unit Specific Progressive Alignment," which was filed on Sep. 19, 2016, the entirety of the disclosure of which is hereby incorporated herein by this reference.

TECHNICAL FIELD

The disclosure relates in general to semiconductor devices and, more particularly, to the formation of semiconductor devices comprising unit specific progressive alignment.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the semiconductor die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Back-end processing of semiconductor die includes a number of surface mount technologies (SMT) that are used to connect semiconductor die or integrated circuits to surfaces of substrates and printed circuit boards (PCBs) without the use of through holes in the PCBs. Quad Flat Packages (QFP) use SMT that includes leads that extend from each of the four sides of the package, sometimes referred to as "gull wing leads." QFP leads provide electrical Input/Output (I/O) interconnection between the semiconductor die within the package and the PCB or substrate to which the QFP is mounted. Other SMT packages are made without leads and are commonly referred to as flat no lead packages. Examples of flat no lead packages are Quad-flat no leads packages (QFNs) and dual-flat no lead (DFN) packages. QFN packages conventionally include a semiconductor die connected by wirebonds to a leadframe that is used for package I/O interconnection.

One approach to back-end processing that more efficiently produces packaged semiconductor devices is the use of panelized packaging, in which a number of semiconductor die are formed into a panel and processed simultaneously at a level of a reconstituted wafer or panel. One form of panelized packaging used to package semiconductor die is fan-out wafer level packaging (FOWLP). FOWLPs involve placing multiple semiconductor die "face down" or with an active surface of the semiconductor die oriented toward a temporary carrier or substrate, such as a temporary tape carrier. FOWLPs can also be fabricated by placing the semiconductor die "face up" on a temporary or permanent carrier. The semiconductor die and substrate or carrier is overmolded with an encapsulant, such as an epoxy molding compound, using, for example, a compression molding process. After molding, the carrier tape is removed to expose the active surface or the back surface of the multiple semiconductor die formed together as a reconstituted wafer. Subsequently, a wafer level chip scale package (WLCSP) build-up interconnect structure is formed on top of the reconstituted wafer. Conductive bumps can then formed over the build-up interconnect structure as a ball grid array (BGA), which is attached to the reconstituted wafer. After formation of the BGA, the reconstituted wafer is singulated to form individual semiconductor devices or BGA packages that can provide more numerous package I/O connections than conventional packages.

SUMMARY

The foregoing and other aspects, features, and advantages will be apparent to those artisans of ordinary skill in the art from the DESCRIPTION and DRAWINGS, and from the CLAIMS.

Accordingly, in an aspect, the present application discloses a method of making a semiconductor device that can comprise measuring a true position of each of a plurality of semiconductor die within an embedded die panel and determining a total radial shift of each of the plurality of semiconductor die. The total radial shift of each of the plurality of semiconductor die can be distributed to two or more layers for each of the plurality of semiconductor die by assigning a portion of the total radial shift to each of the layers according to a priority list to form a distributed radial shift for each of the layers. A transformation for each of the layers for each of the plurality of semiconductor die can be determined using the distributed radial shift for each of the layers. A unit specific pattern can be formed over each of the plurality of semiconductor die, the unit specific pattern comprising the transformation for each of the layers.

The method of making the semiconductor device can further comprise determining a total radial shift of each of the plurality of semiconductor die, and further comprises calculating the total radial shift of each of the plurality of semiconductor die at a limiting feature relative to a center of each of the plurality of semiconductor die, and wherein the limiting feature is a feature on each of the plurality of semiconductor die farthest from the center of each of the plurality of semiconductor die. Forming the unit specific pattern can comprise forming a lithography pattern, and applying the lithography pattern over each of the plurality of semiconductor within the embedded die panel. A distributed amount of the total radial shift for one or more layers having a high priority in the priority list can be maximized to an amount allowed by an allowable radial shift for each of the one or more layers, and a sum of the distributed amount totaled over the two or more layers for each of the plurality of semiconductor die can be less than a total allowable radial shift. The total radial shift can be distributed across the layers proportional to a fraction of an allowable radial shift for each of the layers over a total allowable radial shift. Forming a unit specific pattern over each of the plurality of semiconductor die can further comprise dividing design elements in each of the layers into at least two sets, wherein a distributed amount of the total radial shift for each of the design elements in a first set of the sets is set as zero, and generating the unit specific pattern for each of the layers using the distributed amount of the total radial shift for the each design element in each of the layers. The design elements in the first set can comprise at least one of a saw street, an under-bump via, and an under-bump metal pad, and calculating the transformation can further comprise calculating a translation and a rotation. The embedded die panel can comprise two or more partitions, each partition comprising one or more semiconductor die, and the measuring, determining, distributing, and calculating occurring separately for each of the two or more partitions.

In another aspect, the application discloses a method of making a semiconductor device comprising determining a true position of a semiconductor die within an embedded die panel, and determining a total radial shift of the semiconductor die. The total radial shift of the semiconductor die can be distributed to two or more layers of a unit specific pattern according to a priority list to form a distributed radial shift for each of the layers. Transformation components can be calculated for each of the layers of the unit specific pattern according to the distributed radial shift for each of the layers. The layers of the unit specific pattern can be formed over the semiconductor die.

The method of making the semiconductor device can further comprise determining a total radial shift of the semiconductor die, and further comprises calculating the total radial shift of the semiconductor die at a limiting feature relative to a semiconductor die center of the semiconductor die, and the limiting feature being a feature on the semiconductor die farthest from the semiconductor die center of the semiconductor die. A distributed amount of the total radial shift for one or more layers having a high priority in the priority list can be maximized to an amount allowed by an allowable radial shift for the one or more layers. The total radial shift can be distributed across the layers proportional to a fraction of an allowable radial shift for each of the layers over a total allowable radial shift. Forming the layers of the unit specific pattern over the semiconductor die can further comprise dividing design elements in each layer into at least two sets, wherein a distributed amount of the total radial shift for each of the design elements in a first set of the sets is set as zero, and the unit specific pattern for each of the layers can be generated using the distributed amount of the total radial shift for the each design element in each of the layers. The design elements in the first set can comprise at least one of a saw street, an under-bump via, and an under-bump metal pad.

In another aspect, the application discloses a method of making a semiconductor device can comprise determining a true position of a semiconductor die within an embedded die panel, determining a total radial shift of the semiconductor die, distributing the total radial shift of the semiconductor die to two or more layers of a pattern to form a distributed radial shift, and forming the layers of the pattern over the semiconductor die.

The method of making the semiconductor device can further comprise determining a total radial shift of the semiconductor die, and further comprises calculating the total radial shift of the semiconductor die at a limiting feature relative to a center of the semiconductor die, and the limiting feature being a feature on the semiconductor die farthest from the center of the semiconductor die. A distributed amount of the total radial shift for one or more layers having a high priority in a priority list can be maximized to an amount allowed by an allowable radial shift for the one or more layers. The total radial shift can be distributed across the layers proportional to a fraction of an allowable radial shift for each of the layers over a total allowable radial shift. Forming the layers of the pattern over the semiconductor die can further comprise dividing design elements in each layer into at least two sets, wherein a distributed amount of the total radial shift for each of the design elements in a first set of the sets is set as zero, and generating a unit specific pattern for each of the layers using the distributed amount of the total radial shift for the each design element in each of the layers. The design elements in the first set can comprise at least one of a saw street, an under-bump via, and an under-bump metal pad.

BRIEF DESCRIPTION OF THE DRAWINGS

FIGS. 3A-3L illustrate non-limiting examples of unit specific progressive alignment being used in a method of making a semiconductor device.

DETAILED DESCRIPTION

Figure 1:
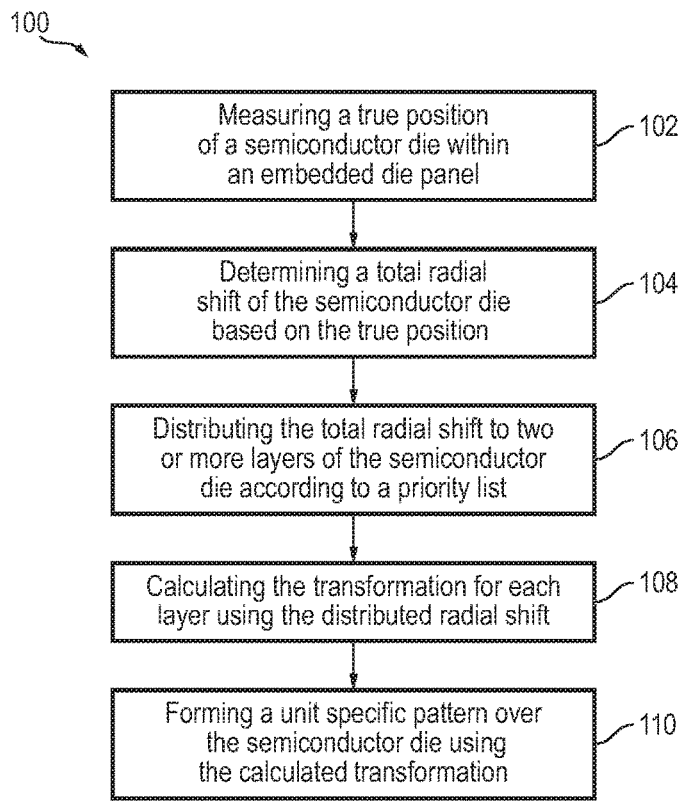
FIG. 1 illustrates a flow chart of an exemplary method of making a semiconductor device.

The present disclosure includes one or more embodiments in the following description with reference to the figures, in which like numerals represent the same or similar elements. While the description is written in terms of the best mode, it will be appreciated by those skilled in the art that it is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

Semiconductor devices are generally manufactured using two complex manufacturing processes: front-end manufacturing and back-end manufacturing. Front-end manufacturing involves the formation of a plurality of semiconductor die on the surface of a semiconductor wafer. Each semiconductor die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is used to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices is decreased to achieve higher density.

By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

This disclosure, its aspects and implementations, are not limited to the specific package types, material types, or other system component examples, or methods disclosed herein. Many additional components, manufacturing and assembly procedures known in the art consistent with semiconductor manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

While this disclosure includes a number of embodiments in different forms, there is presented in the drawings and written descriptions in the following pages detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

FIG. 1 shows a flowchart 100 of an overview of an exemplary method or process of unit specific progressive alignment, or Progressive Adaptive Alignment™, which is discussed in greater detail below, with respect to the subsequent figures. FIG. 1 shows the system and method 100 for developing an alignment and patterning of semiconductor devices, semiconductor packages, or FOWLPs 400, 410, 430 with a unique, or unit specific, translation and rotation for portions of one or more layers, or for each layer, of each package 400, 410 to account for misalignment of semiconductor die 334 within embedded die panel 380.

More specifically FIG. 1 shows, an embedded die panel 380 is made and a true position of each semiconductor die 334 in the panel 380 is measured (see, e.g., feature 102 and FIGS. 3A-3G). The total radial shift $R_m$ of the semiconductor die is determined based on a true, actual, or measure position of the semiconductor die (see, e.g., feature 104 and FIGS. 3F, 3G, and 4A). The total radial shift $R_m$ is then distributed to two or more layers of the semiconductor die according to a priority list 205 (see, e.g., features 106, 205 and FIGS. 1-2, 3H-3L and 5A-5C). The transformation for each layer L within the semiconductor packages 400, 410 may be calculated using the distributed radial shift $R_d$ for a particular layer L (see, e.g., feature 108 and FIGS. 3H-3L and 5A-5C). The transformation comprises translation (dx, dy) and rotation (θ) components. A unit specific pattern 399 is formed over the semiconductor die using the calculated transformation (see, e.g., feature 110 and FIGS. 3H-3L and 5A-5C).

Figure 2:
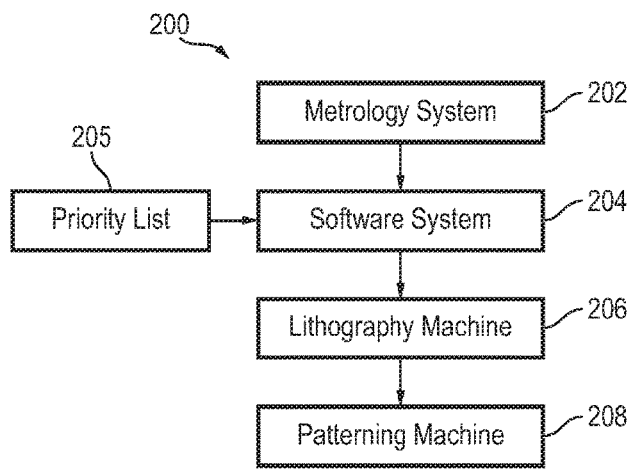
FIG. 2 illustrates an exemplary system used to implement the method in FIG. 1.

FIG. 2 shows a flowchart 200 of an overview of an exemplary system or group of machines that can be used to implement the method or process of unit specific progressive alignment shown in FIG. 1. A metrology system 202 can be used to measure the true position of each semiconductor die 334 in the embedded die panel 380 relative to a nominal position (see, e.g., feature 386 and FIGS. 3F), wherein the nominal position of the semiconductor die 334 can be expected, planned, or theoretical position of the semiconductor die 334 without accounting for actual shift or movement of the semiconductor die, which can result, for example, from displacement by an encapsulating material as shown, e.g., in FIG. 3D. A software system 204 can be used to determine the total radial shift $R_m$ using the true position measured by the metrology system 202, distribute the total radial shift $R_m$ to two or more layers of the semiconductor die, and calculate the transformation for each layer corresponding to the distributed radial shift $R_d$ to that layer. A lithography machine 206 can be used to form a unit specific pattern 399 using the transformation calculated by the software system 204. A (maskless) patterning machine 208 can then apply any one, or all, of the unit specific patterns 399 onto the semiconductor die in the panel.

Figure 3A:
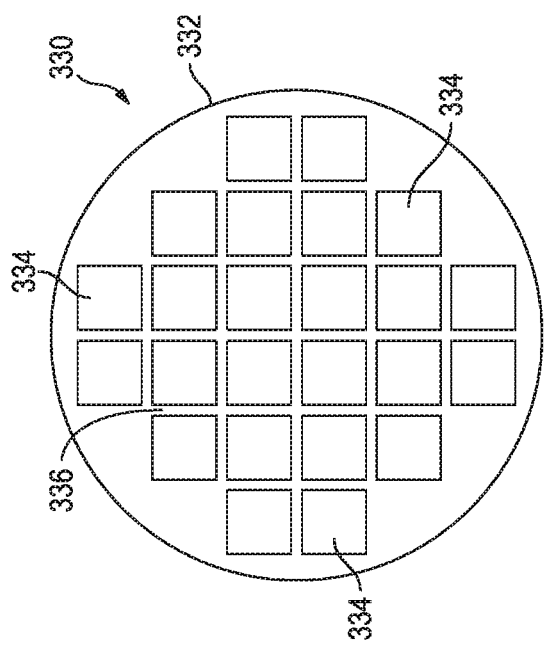

FIGS. 3A-3L show an exemplary fabrication process including formation of semiconductor packages 400, 410, and 430. such as FOWLPs, in which unit specific progressive alignment is used. FIG. 3A shows a semiconductor wafer 330 with a base substrate material 332, such as, without limitation, silicon, germanium, gallium arsenide, indium phosphide, or silicon carbide, for structural support. A plurality of semiconductor die or components 334 is formed on wafer 330 separated by a non-active, inter-die wafer area or saw street 336 as described above. Saw street 336 provides cutting areas to singulate semiconductor wafer 330 into individual semiconductor die 334.

Figure 3B:
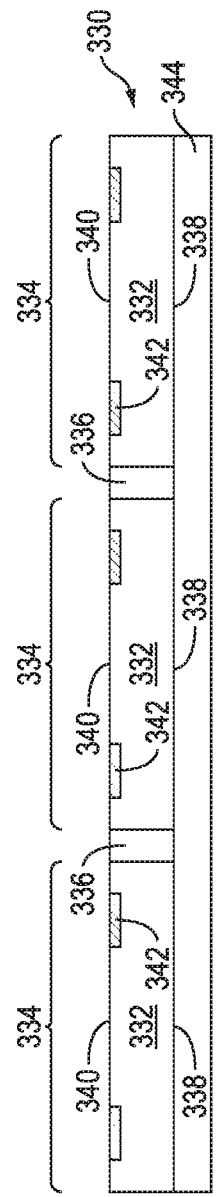

FIG. 3B shows a cross-sectional view of a portion of semiconductor wafer 330 depicted in FIG. 3A. FIG. 3B further shows each semiconductor die 334 has a backside or back surface 338 and an active surface 340 opposite the backside. Active surface 340 contains analog or digital circuits implemented as active devices, passive devices, conductive layers, and dielectric layers formed within the semiconductor die and electrically interconnected according to the electrical design and function of the semiconductor die. For example, the circuit may include one or more transistors, diodes, and other circuit elements formed within active surface 340 to implement analog circuits or digital circuits, such as DSP, ASIC, memory, or other signal processing circuit. Semiconductor die 334 may also contain IPDs such as inductors, capacitors, and resistors, for RF signal processing.

An electrically conductive layer or pad 342 is formed over active surface 340 using PVD, CVD, electrolytic plating, electroless plating process, or other suitable metal deposition process. Conductive layer 342 can be one or more layers of Al, Cu, Sn, Ni, Au, Ag, or other suitable electrically conductive material. Conductive layer 342 operates as contact pads or bond pads electrically connected to the circuits on active surface 340. Conductive layer 342 can be formed as contact pads disposed side-by-side a first distance from the edge of semiconductor die 334, as shown in FIGS. 3B and 3G. Alternatively, conductive layer 342 can be formed as contact pads that are offset in multiple rows such that a first row of contact pads is disposed a first distance from the edge of the semiconductor die, and a second row of contact pads alternating with the first row is disposed a second distance from the edge of the semiconductor die.

Semiconductor wafer 330 can also undergo an optional grinding operation to planarize the backside surface and reduce a thickness of the semiconductor wafer. Similarly, an optional chemical etch can also be used to remove and planarize semiconductor wafer 330. With wafer 330 comprising a desired thickness, an optional backside coating 344 may be formed over backside 338 of semiconductor die 334. Backside coating 344 may be a polymer layer, dielectric film, epoxy film, or other suitable material having similar insulating and structural properties that can contain one or more layers of $SiO_2$, $Si_3N_4$, SiON, tantalum pentoxide ($Ta_2O_5$), $Al_2O_3$, polyimide, benzocyclobutene (BCB), and polybenzoxazoles (PBO). Backside coating 344 may be formed by a lamination process, molding process, or other suitable process. Alternatively, optional backside coating 344 may be omitted such that backside 338 remains exposed as part of a final package or remains exposed for subsequent encapsulation or covering. In another embodiment, backside coating 344 may be one or more ay of a thermally conductive material such as Al, Cu, Ni, Cu and Ni, or other suitable material with high thermal conductivity that is formed by a process such as printing, PVD, CVD, sputtering, electrolytic plating, electroless plating, metal evaporation, metal sputtering, or other suitable process. A thermally conductive backside coating 344 can form a thermally conductive path that aids with distribution and dissipation of heat generated by semiconductor die 334 and increases the thermal performance of the subsequently formed FOWLP. While backside coating 344 is shown in FIG. 3B as being formed on backside 338 of semiconductor wafer 330 before the wafer is singulated into individual semiconductor die, the backside coating 344 may also be formed on individual semiconductor die 334 after singulation.

Figure 3C:
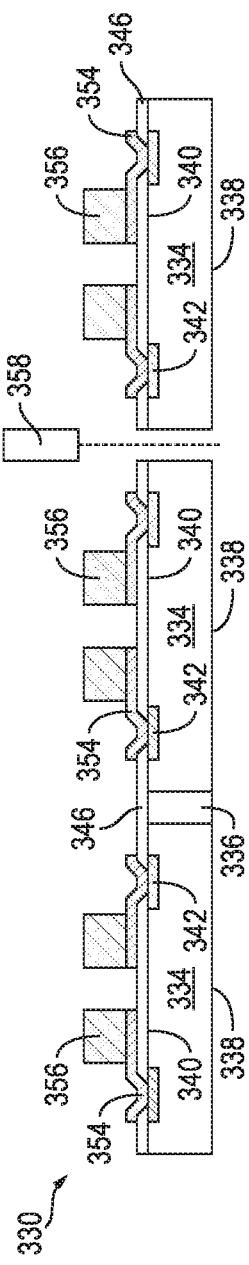

FIG. 3C shows semiconductor wafer 330 without optional backside coating 344 and with optional insulating or passivation layer 346 and an optional electrically conductive layer or redistribution layer (RDL) 354. Electrically conductive layer or RDL 354 may be formed over insulating layer 346 and conductive layer 342 using a patterning and metal deposition process such as printing, PVD, CVD, sputtering, electrolytic plating, electroless plating, metal evaporation, metal sputtering, or other suitable metal deposition process. Conductive layer 354 can be one or more layers of Al, Cu, Sn, Ni, Au, Ag, or other suitable electrically conductive material. In some embodiments, conductive layer 354 is an RDL comprising a titanium tungsten (TiW) seed layer, a Cu seed layer, and a Cu layer formed over the TiW seed layer and the Cu seed layer. Conductive layer 354 may follow the contours of conductive layer 342 and insulating layer 346 or semiconductor die 334. Conductive layer 354 provides electrical paths between portions of conductive layer 342 and electrical interconnects, interconnects, interconnect structures, semiconductor die-pads, Cu studs, a Cu stud layer, or copper posts, pillars, or columns 356. Portions of conductive layer 354 may be electrically common or electrically isolated depending on the design and function of the later mounted semiconductor die. Conductive layer 354 may operates as a fan-in RDL that provides additional flexibility in determining a position of electrical interconnects 356.

FIG. 3C also shows electrical interconnects or copper studs, pillars, posts, or columns 356 formed over, and directly connected to, conductive layer 354. In other instances, electrical interconnects 356 may be directly connected to, or in contact with, contact pads or conductive layer 342, or otherwise electrically coupled to the conductive layer 342 without conductive layer 354. After the formation of interconnects 356, semiconductor wafer 330 may be singulated through saw street 336 using a saw blade or laser cutting tool 358 into individual semiconductor die 334.

Figure 3D:
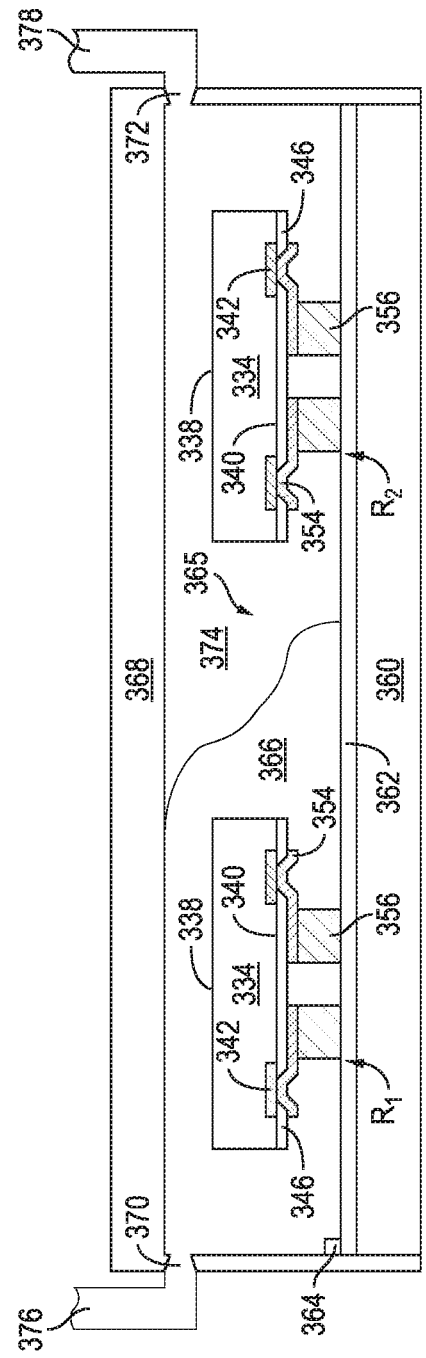
Figure 3G:
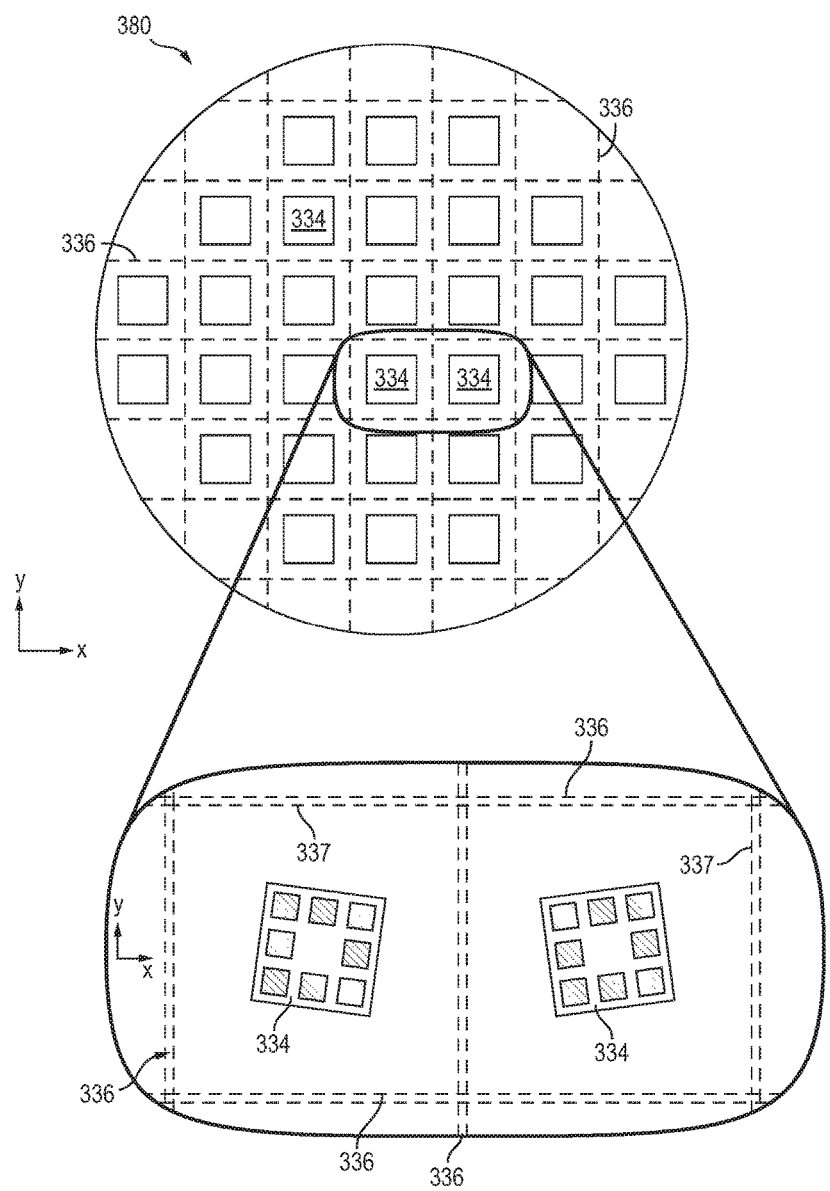

FIG. 3D shows a carrier or substrate 360 containing temporary or sacrificial base material such as metal, silicon, polymer, beryllium oxide, or other suitable low-cost, rigid material for structural support. An optional interface layer or double-sided tape 362 may be formed over carrier 360 as a temporary adhesive bonding film or etch-stop layer. A number of fiducial alignment marks or fiducials 364 may be positioned over or attached to carrier 360 or interface layer 362. Alternatively, a portion of carrier 360 or interface layer 362 is removed or marked to form fiducial 364. Fiducial 364 allows for orientation and handling of carrier 360 with respect to the subsequent mounting of semiconductor die 334.

FIG. 3D further shows semiconductor die 334 from FIG. 3C mounted face down to carrier 360 and interface layer 362 with active surface 340 oriented towards the substrate. Alternatively, semiconductor die 334 from FIG. 3B can also be mounted face up to carrier 360 and interface layer 362. In either event, whether positioned face up or face down, the semiconductor die 334 may subsequently undergo the processing described with respect to FIGS. 3D-3F, 3H-3I as described in greater detail herein. Semiconductor die 334, whether face up or face down, may be positioned with respect to fiducial 364 according to a nominal or predetermined position and spacing for the semiconductor die. The nominal positions selected for each of semiconductor die 334 are determined as part of a nominal or predetermined panel design that facilitates the formation of final packages or FOWLPs, such as devices 400, 410, for each semiconductor die 334. The nominal panel design provides adequate space for the formation of RDLs, fan-out build-up interconnect structures, or both, for each semiconductor die 334 and singulation among the final devices or packages.

Accordingly, FIG. 3D shows a first semiconductor die 334 is mounted or disposed over carrier 360 at a point of reference R1, as measured from fiducial 364, that corresponds to the location of the first semiconductor die within the nominal panel design. Similarly, a second semiconductor die 334 may be mounted or disposed over carrier 360 at a point of reference R2, as measured from one or more fiducials 364, which corresponds to the location of the second semiconductor die within the nominal panel design. Semiconductor die 334 may be separated by a space or gap 365 when mounted over carrier 360 that provides an area for a subsequently formed fan-out interconnect structure. A size of the space or gap 365 may include sufficient area for optionally mounting semiconductor devices or components within the subsequently formed FOWLPs.

FIG. 3D also shows an encapsulant 366 is deposited using a paste printing, compressive molding, transfer molding, liquid encapsulant molding, vacuum lamination, spin coating, or other suitable applicator. Specifically, FIG. 3D shows a mold 368 with a plurality of inlets 370 and 372 brought together with carrier 360 and interface layer 362 to enclose semiconductor die 334 within the mold 368 for subsequent encapsulation. Mold 368 is brought together by moving mold 368 around semiconductor die 334, or alternatively, by moving the semiconductor die 334 into the mold 368. Mold 368 can include only a first or top portion that is brought together with carrier 360 and interface layer 362 without a second or bottom mold portion. In an embodiment, carrier 360 and interface layer 362 serve as the bottom mold portion for the subsequent encapsulation process. Alternatively, semiconductor die 334, carrier 360, and interface layer 362 may be disposed within a mold including multiple portions, such as top and bottom portions.

FIG. 3D further shows mold 368 encloses semiconductor die 334 with a cavity or open space 374. Cavity 374 extends between mold 368 to semiconductor die 334 and interface layer 362. A volume of encapsulant 366 may be injected from dispenser 376 under an elevated temperature and pressure through inlet 370 into cavity 374 and over semiconductor die 334 and carrier 360. Inlet 372 can be an exhaust port with optional vacuum assist 378 for excess encapsulant 366. Encapsulant 366 may be a polymer composite material, such as epoxy resin with filler, epoxy acrylate with filler, or polymer with proper filler. The volume of encapsulant 366 is measured according to the space requirements of cavity 374 less the area occupied by semiconductor die 334 and any additional semiconductor devices that might be present. Encapsulant 366 may be evenly dispersed and uniformly distributed under an elevated temperature within cavity 374 around semiconductor die 334. A viscosity of encapsulant 366 may be selected for uniform coverage. For example, a lower viscosity can increase the flow of the encapsulant for molding, paste printing, and spin coating. Semiconductor die 334 are embedded together in encapsulant 366 which is non-conductive and environmentally protects the semiconductor device from external elements and contaminants. The encapsulant can cover, directly contact, or 5 or 6 sides or surfaces of the semiconductor die, including sides, ends, or both sides and ends of the electrical interconnects 356 in a single step.

In FIG. 3E, semiconductor die 334 are removed from mold 368. Carrier 360 and interface layer 362 may be removed by chemical etching, mechanical peeling, CMP, mechanical grinding, thermal bake, UV light, laser scanning, or wet stripping to expose encapsulant 366. A surface of encapsulant 366 may be substantially coplanar with backside 338, which is exposed by the removal of carrier 360 and interface layer 362. FIG. 3E shows that, after removal of carrier 360 and interface layer 362, encapsulant 366 disposed around semiconductor die 334 to form an embedded die panel, reconstituted panel, or panel 380. Panel 380 includes a footprint or form factor of any shape and size that allows for, and facilitates, the subsequent processing to form FOWLPs as described in greater detail below. In an embodiment, panel 380 includes a form factor similar to the form factor of a 300 mm semiconductor wafer and includes a circular footprint having a diameter of 300 mm. In other instances, panel 380 may comprise a square or rectangular form factor, and in any event, can have a diameter, length, or width that is less than or greater than 300 mm, such as 200 mm, 450 mm, or more.

FIG. 3E also shows panel 380 may also undergo an optional grinding operation with grinder 382 to planarize the surface and reduce the thickness of the panel 380. A chemical etch can also be used to remove and planarize a portion of encapsulant 366 in panel 380. Thus, a surface of interconnects 356 may be exposed with respect to encapsulant 366 at a surface of the panel 380 to electrically connect semiconductor die 334 to a subsequently formed fan-out interconnect structure.

In FIG. 3E, an optional backside coating 384, similar to backside coating 344 in FIG. 3B, may be formed over backside 338 of semiconductor die 334 and over a surface of encapsulant 366 that is substantially coplanar with backside 338. Backside coating 384 may be a polymer layer, dielectric film, epoxy film, or other suitable material having similar insulating and structural properties that can contain one or more layers of $SiO_2$, $Si_3N_4$, $SiON$, $Ta_2O_5$, $Al_2O_3$, polyimide, BCB, and PBO. Backside coating 384 may be formed by a lamination process, molding process, or other suitable process. In an embodiment, backside coating 384 may be an optically transparent material that facilitates optical scanning of objects within panel 380, such as semiconductor die 334, interconnects 356, and fiducials 364. In another embodiment, backside coating 384 may be one or snore layers of a thermally conductive material such as Al, Cu, Ni, Cu and Ni, or other suitable material with high thermal conductivity that is formed by a process such as printing, PVD, CVD, sputtering, electrolytic plating, electroless plating, metal evaporation, metal sputtering, or other suitable process. Thermally conductive backside coating 384 may form a thermally conductive path that aids with distribution and dissipation of heat generated by semiconductor die 334 and increases the thermal performance of the subsequently formed FOWLPs. Alternatively, optional backside coating 384 may be omitted such that backside 338 remains exposed as part of a final package, or subsequently covered. Backside coating 384 may be formed on panel 380 before or after a portion of encapsulant 366 is removed from the panel.

FIG. 3F schematically shows a scanner 386—which can include or be the metrology system 202 shown in FIG. 2—inspecting panel 380 to determine a true or actual position of semiconductor die 334 within panel 380. Scanner 386 may use optical imaging, acoustic imaging, magnetic imaging, radiofrequencies, infrared, or other suitable process to determine a true or actual position of semiconductor die 334, or other object including optional semiconductor devices, within panel 380. The true position and rotation of each semiconductor die 334 or other object is determined with respect to a global point of reference or fiducial 364 on panel 380. Fiducial(s) 364 may be transferred from carrier 360 with the formation of encapsulant 366 and the removal of carrier 360 and interface layer 362. Fiducial 364 may also include a number of new fiducial alignment marks that are positioned over or attached to panel 380, or are formed by marking or removing a portion of panel 380. Alternatively, the fiducial 364 incorporated or identified with the panel 380 need not be physically identified as part of panel 380, but instead may be associated with a portion of scanner 386 or an attachment point between panel 380 and scanner 386.

As shown in FIG. 3F, scanner 386 may inspect features on each semiconductor die 334 to determine actual position and rotation of every semiconductor die 334 on panel 380 with respect to fiducial 364. The features identified by scanner 386 on each semiconductor die 334 include a location of an edge or corner of the semiconductor die 334, a position of interconnect 356 including a corner, center, or outline of the interconnect, or any other feature on or associated with the semiconductor die 334. The actual or measured position of semiconductor die 334 includes an x-y position that accounts for a lateral or translational shift in one or more directions of the semiconductor die 334 with respect to fiducial 364 within panel 380. Similarly, the actual or measured position of semiconductor die 334 also includes an orientation or angular rotation with respect to fiducial 364.

As illustrated in FIG. 3F, first semiconductor die 334 is encapsulated within panel 380 and is located at point of reference R3, which is measured with respect to fiducial 364. Similarly, second semiconductor die 334 is encapsulated within panel 380 at a point of reference R4, which is measured with respect to fiducial 364. When semiconductor die 334 are precisely and accurately placed at points of reference R1 and R2, and the semiconductor die 334 do not undergo any movement or shifting during encapsulation, and R1 will be equal to R3, and R2 will be equal to R4. However, movement of semiconductor die 334 from the nominal position of the predetermined panel design results in points of reference R3 and R4 being different from points of reference R1 and R2, respectively. Movement of semiconductor die 334 away from their nominal positions and fiducial 364 results from inaccuracies in mounting the semiconductor die 334 over carrier 360. Additionally, movement of semiconductor die 334 also results from shifts in the position of the semiconductor die 334, which occur during encapsulation. For example, a force resulting from encapsulant 366 contacting semiconductor die 334 can cause semiconductor die 334 and interconnects 356 to shift with respect to fiducial 364 and shift with respect to the nominal position of the semiconductor die 334 within the predetermined panel design, that is, points of reference R1 and R2.

After the true position and orientation of each semiconductor die 334 and interconnect 356 within panel 380 is determined by scanner 386—as shown at element 102 of FIG. 1—the true positions of the semiconductor die 334, for example R3 and R4, are compared to the nominal positions of the semiconductor die 334 within the nominal panel design, for example R1 and R2, to determine the change of position or radial shift $R_m$ of each semiconductor die 334 and interconnect 356 that occurred during processing—as shown at element 104 of FIG. 1. By ascertaining the difference in position between the nominal or original design position or pattern of semiconductor die 334 and interconnects 356—such as nominal pattern 402 shown in FIG. 4A—and the actual position or pattern of the semiconductor die 334 and interconnects 356—such as actual pattern 404 shown in FIG. 4A—potential problems with the subsequent formation of a fan-out build-up interconnect structure over the semiconductor can be identified and averted.

A potential problem exists if a true position of a semiconductor die 334, for example, R3 and R4, has shifted such that the true position of an interconnect 356 will no longer align or provide a good electrical connection with the subsequently formed RDL or build-up interconnect structure 397, such as conductive layer 390 shown and discussed with respect to FIGS. 3H-3L. The fan-out build-up interconnect structure or build-up interconnect structure 397 as originally designed for panel 380 will not align with some semiconductor die 334 or interconnects 356 because the build-up interconnect structure 397 as originally designed is based on the nominal positions of the semiconductor die 334 within the panel design, for example R1 and R2, and not the actual or true position of semiconductor die 334 and interconnects 356 after having been formed as part of panel 380, for example R3 and R4. Accordingly, at least a portion of the original design of the build-up interconnect structure 397 is modified before being applied to panel 380 to avoid the problems of misalignment and inadequate electrical connections between the interconnect structure and semiconductor die 334 to reduce, minimize, or eliminate a number of defective semiconductor die packages 400, 410. In an embodiment, position data for semiconductor die 334 and interconnects 356 are imported into a software system 204, such as pattern auto-router, which accounts for the true or measured positions of semiconductor die 334 and produces a new design that adjusts or selects new locations for at least a portion of the build-up interconnect structure 397, for example, vias, RDLs, pads, and traces, or any portion of layers a-e or elements 280, 288, 288, 304, 306, 390, 392, 394, and 396 to connect to interconnects 356 of semiconductor die 334. Individual package designs are combined to form a drawing of the full panel for each layer. The difference in shift from nominal to true positions dictates how the individual package designs are combined to form the full panel design. In an embodiment, design files for each panel are imported to a lithography machine 206 that uses the design data to dynamically apply a custom, unit specific pattern to each panel with patterning machine 208, as shown in FIG. 2. As described in greater detail below, such as with respect to FIGS. 4A and 4B, the custom unit specific patterning and modification of the build-up interconnect structure 397 and the unit specific patterns 399 may be based on the total measured radial shift $R_m$ and the limiting feature 420, and may be formed using a maskless process.

FIG. 3G shows a plan view or top view of panel 380 including a plurality of semiconductor die 334 separated by saw streets 336. Each individual semiconductor die 334 may be translated, rotated, or both from its nominal position within the panel 380. Related view of the shift of the semiconductor die 334 within a final package 400 or 410 are shown in, and described with respect to, FIGS. 4A and 4B, which are shown in greater detail below.

FIG. 3H shows an insulating or passivation layer 388 conformally applied over panel 380 and interconnects 356. Insulating layer 388 may include one or more layers that are applied using PVD, CVD, screen printing, spin coating, spray coating, sintering, or thermal oxidation. Insulating layer 388 contains one or more layers of SiO2, Si3N4, SiON, Ta2O5, Al2O3, polyimide, BCB, PBO or other material having similar insulating and structural properties. In an embodiment, passivation layer 388 is an optional polymer layer and can be omitted. Openings may be formed completely through insulating layer 388 to expose at least a portion of conductive interconnects 356 for subsequent electrical connection. Alternatively, because insulating layer 388 is optional, conductive interconnects 356 may be exposed for subsequent electrical interconnection in the absence of forming the insulating layer, such as when conductive layer 390 would be formed directly on the conductive interconnects 356 and the encapsulant or mold 366.

FIG. 3H shows a portion of insulating layer 388 may be removed by etching, laser drilling, mechanical drilling, or other suitable process to form openings 387 completely through insulating layer 388 to expose interconnects 356. The positions of the openings 387 in insulating layer 388 can be adjusted. For example, openings 387 in insulating layer 388 may be adjusted by all or a portion of a total distributed radial shift $R_d$, which may be all or a portion of the total radial shift $R_m$, that can include an x-y translation, a rotation by an angle θ, or both, with respect to fiducial 364 on panel 380. Additional description of the distributed radial shift $R_d$, and how portions of the total radial shift $R_d$ is allocated among vertically offset layers of the package is described below with respect to FIGS. 3K, 3L, and 4A-5C. In any event, when distributing portions of the total measured radial shift $R_m$, or all of the total measured radial shift $R_m$, a person of ordinary skill in the art will understand that distributing "all" of the total measured radial shift $R_m$ can comprise 100 percent of the total measured radial shift $R_m$ or substantially all of the total measured radial shift $R_m$, where substantially can be within a percent difference of less than or equal to 1%, 1%, 3%, 4%, 5%, or more, up to 10%, 15%, or 20%, either overall, or on a per layer basis for all layers $L_4$, such as 99%, 98% 95%, 90%, etc.

FIG. 3H also shows an electrically conductive layer, a conductive layer, or an RDL layer 390 is patterned and deposited over insulating layer 388 and interconnects 356 as a fan-out RDL. Conductive layer 390 can be one or more layers of Al, Cu, Sn, Ni, Au, Ag, or other suitable electrically conductive material. The deposition of conductive layer 390 may use PVD, CVD, electrolytic plating, electroless plating, or other suitable process. In an embodiment, conductive layer 390 is an RDL comprising a TiW seed layer, a Cu seed layer, and Cu layer formed over the TiW seed layer and the Cu seed layer. Conductive layer 390 provides electrical interconnection between electrical interconnects 356 and subsequently formed bumps or package interconnects that provide for the transmission of electrical signals between semiconductor die 334 and points external to the FOWLP. With the changes in the position of a semiconductor die 334 and interconnects 356 with respect to fiducial 364, conductive layer 390 can be adjusted by a distributed radial shift $R_d$ which may include an x-y translation, a by rotation of an angle θ, or both, with respect to fiducial 364.

FIG. 3H shows an insulating or passivation layer 392 conformally applied over panel 380 and conductive layer 390. Insulating layer 392 includes one or more layers that may be applied using PVD, CVD, screen printing, spin coating, spray coating, sintering, or thermal oxidation. Insulating layer 392 contains one or more layers of SiO2, Si3N4, SiON, Ta2O5, Al2O3, polyimide, BCB, PBO or other material having similar insulating and structural properties. In an embodiment, passivation layer 392 is a polymer layer.

FIG. 3H further shows a portion of insulating layer 392 may be removed by etching, laser drilling, mechanical drilling, or other suitable process to form openings completely through insulating layer 392 and to expose at least a portion of conductive layer 390 for subsequent electrical interconnection. Locations for the openings in insulating layer 392 may be formed at nominal locations or modified locations with respect to an outer profile or package edge 337. The openings formed in insulating layer 392 can be adjusted or unadjusted according to an amount of distributed radial shift $R_d$ between the conductive layer 390 and the UBM 398. The locations of the openings in insulating layer 392, and corresponding vias, such as vias 306 shown in FIG. 3K, based on measured positions of semiconductor die 334 and interconnects 356, allow for good electrical connectivity within the devices or package 400, 410 while the locations of package interconnects, such a electrical interconnects or solder bumps 396, remain fixed with respect to the outer edge or profile 377 of the packages 40, 410 and do not vary with movement or shifting of semiconductor die 334. Additional description of the distributed radial shift $R_d$ is described with respect to FIGS. 4A-5C.

FIG. 3I shows UBMs 394 formed over conductive layer 390 and insulating layer 392. UBMs 394 can be multiple metal stacks including adhesion, barrier, seed, and wetting layers. Layers of UBM 394 can be Ti, TiN, TiW, Al, Cu, Cr, CrCu, Ni, NiV, Pd, Pt, Au, and Ag. In an embodiment, UBMs 394 comprise a TiW seed layer, a Cu Seed layer, and a Cu UBM layer. The TiW seed layer may be conformally applied over insulating layer 392 and extend into the openings formed in insulating layer 392, when present, and be conformally applied over a portion of conductive layer 390. The Cu seed layer may be conformally applied over the TiW seed layer. The Cu UBM layer may be conformally applied over the TiW seed layer and the Cu seed layer. UBMs 394 act as an intermediate conductive layer between conductive layer 390 and subsequently formed solder bumps or other I/O interconnect structures. UBMs 394 can provide a low resistive interconnect to conductive layer 390, a barrier to solder diffusion, and an increase in solder wettability.

An electrically conductive bump material may be deposited over UBMs 394 and conductive layer 390 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material may be eutectic Sn/Pb, high-lead solder, or lead-free solder. The bump material may be bonded to UBMs 394 using a suitable attachment or bonding process. In an embodiment, the bump material may be reflowed by heating the material above its melting point to form spherical balls or bumps 396. In some applications, bumps 396 are reflowed a second time to improve electrical contact to UBMs 394. The bumps can also be compression bonded to UBMs 394. Bumps 396 represent one type of interconnect structure that can be formed over UBMs 394. The interconnect structure can also use conductive paste, stud bump, micro bump, or other electrical interconnect.

After the formation of bumps 396, panel 380 may be singulated along saw streets 336 334 using a saw blade or laser cutting tool 398 into individual FOWLPs 400.

Figure 3J:
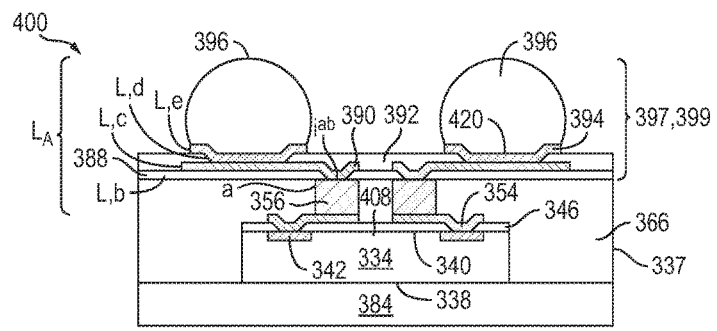

FIG. 3J, continuing from FIG. 3I, shows a completed FOWLP 400. FOWLP 400 includes semiconductor die 334 with optional insulating layer 346, such as polymer, disposed over active surface 340 of the semiconductor die 334. Conductive layer 354, when present, may be formed as a fan-in interconnect structure that connects to contact pads 342 and interconnects or copper pillars 356. Because conductive layer 354 and interconnect structures or copper pillars 356 are formed at the wafer level before singulation of semiconductor die 334, the conductive layer and interconnect structures or copper pillars may be formed without adjusting their patterns because no shifting has occurred during formation of a reconstituted wafer or embedded die panel 380 when the structures are formed over the native wafer 330, as shown in FIG. 3C. Semiconductor die 334, conductive layer or fan-in RDL 354, and interconnect structures 356 are encapsulated with encapsulant 366. Backside coating 384 may be disposed over and contact backside 338 of the semiconductor die 334 and encapsulant 366 formed around a periphery of semiconductor die 334. Backside coating 384 may include a footprint or area equal to a footprint or area of FOWLP 400. Insulating layer 388 may be formed over FOWLP 400 opposite backside coating 384. Conductive layer 390 may be formed as a fan-out RDL that extends outward from a center of FOWLP 400, and is further formed as a unit-specific pattern that aligns with the true position of each semiconductor die 334 or interconnect structure 356. Insulating layer 392 is formed over conductive layer 390 and insulating layer 388. Openings in insulating layer 392 are formed over a portion of conductive layer 390. UBMs 394 are conformally formed over insulating layer 392 and portions of conductive layer 390. One or more UBMs 394 can be partially or completely within a footprint of semiconductor die 334. Alternatively, one or more UBMs 394 can be formed completely outside a footprint of semiconductor die 334. Bumps 396 are formed over UBMs 394 to provide package input/output (I/O) interconnects for FOWLP 400. In an embodiment, a plurality of bumps 396 form an array of bumps or land grid array (LGA) aligned with a periphery or outer profile of FOWLP 400.

Figure 3K:
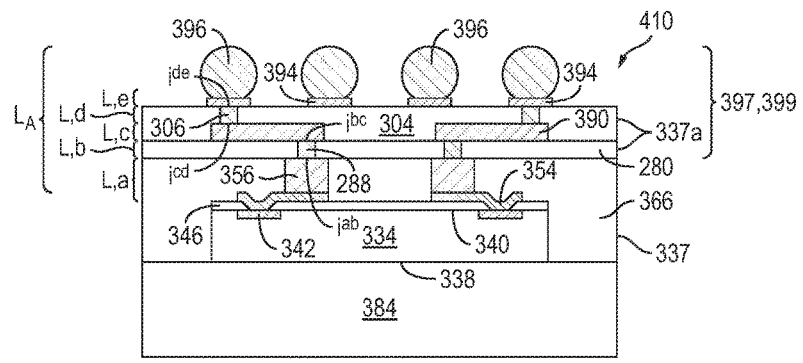

FIG. 3K shows a FOWLP 410 similar to FOWLP 400 depicted in FIG. 3J. The differences between FOWLP 410 and FOWLP 400 are the layers and structures over interconnects 356, and more specifically, the inclusion of separate or discretely formed conductive vias 288 and 306 in FIG. 3K. Vias 288 are formed in openings in insulating layer 280, which is analogous to insulating layer 388 of package 400, and connect to electrical interconnects 356. Vias 306 are formed in openings in insulating layer 304, which is analogous to insulating layer 392 of package 400, and connect to conductive layer or RDL 390.

The openings in insulating layers 304 and 388 are formed by removing a portion of the insulating layers by etching, laser drilling, mechanical drilling, or other suitable process to form openings and an electrically conductive layer or material is deposited in the openings using PVD, CVD, electrolytic plating, electroless plating, or other suitable process to form conductive vias or layers 288 and 306. Conductive vias 288 and 306 can be one or more layers of Al, Cu, Sn, Ni, Au, Ag, titanium (Ti), tungsten (W), polysilicon, or other suitable electrically conductive material.

UBMs 394 are then formed over conductive vias, via layer, under-bump via layer 306 and insulating layer 304, as described with respect to UBMs 394 in FIG. 3I for device or package 400. Similarly, electrically conductive bump material is deposited over UBMs 394 to form bumps 396 for semiconductor device or package 410.

Figure 3L:
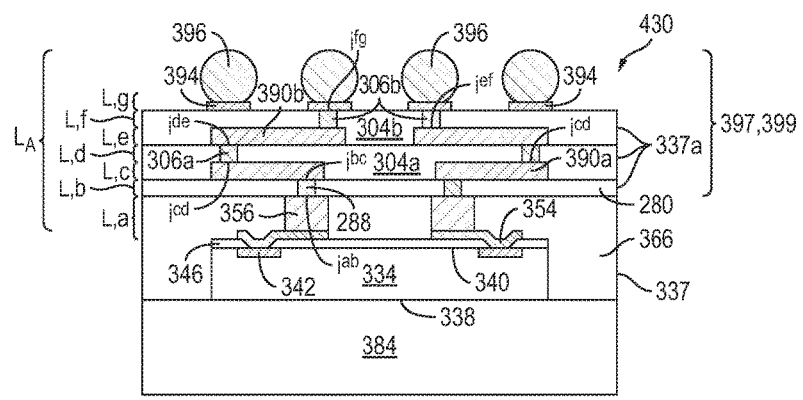

FIG. 3L shows a semiconductor device, semiconductor package, or FOWLP 430 similar to semiconductor package 410 depicted in FIG. 3K. Semiconductor package 430 differs from semiconductor package 410 by including an additional insulating layer 304 and an additional conductive layer or RDL layer 306 as part of the build-up interconnect structure 397 comprising unit specific patterns 399, where any number of suitable layers, including the layers a-g can be included according to the configuration and design of the package to accommodate desired routing and a desired amount of radial shift $R_m$ distributed across the various layers a-g. For convenience, the insulating layers 304 shown in semiconductor package 430 are referred to as insulating layers 304a and 304b, and conductive layers or RDLs 390 are referred to as conductive layers or RDLs 390a and conductive layers or RDLs 390b each of which are vertically separated of spatially offset. Similarly, an additional layer of conductive vias 306 are added so that conductive vias 306 are vertically separated of spatially offset, and are referred to, for convenience, as vias or conductive vias 306a and vias or conductive vias 306b. Inclusions of additional layers can allow for a larger total allowable radial shift R to be accounted for and distributed throughout the package 430.

Figure 4A:
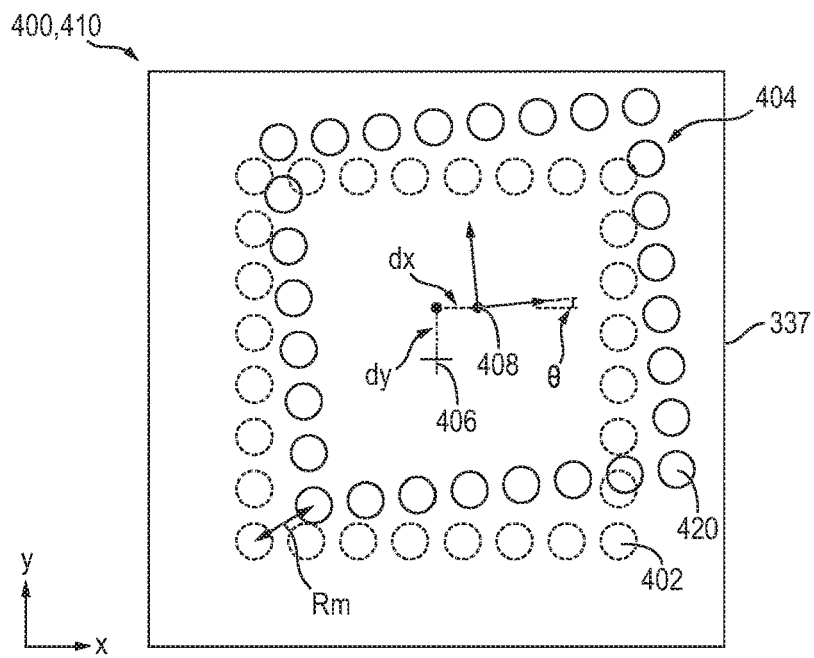
FIGS. 4A and 4B illustrate exemplary positions of a semiconductor die within a device or package.
Figure 4B:
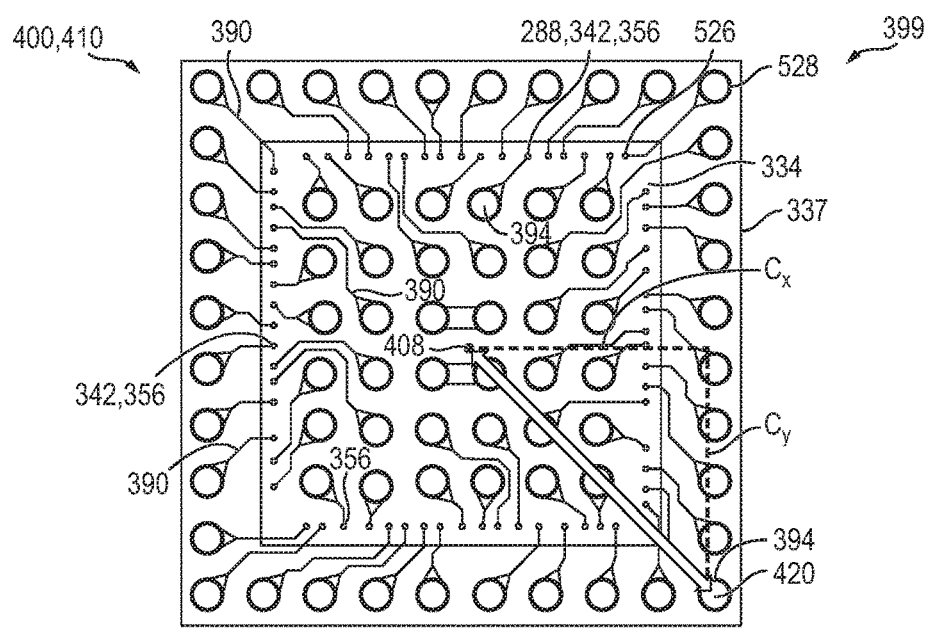

As described above, the true position of a semiconductor die 334 may be different from its design nominal position due to manufacturing variances in the chip-attach, molding fabrication, or other steps. The metrology system 202 can measure the true position of semiconductor die 334 within the panel 380, and output the XY translation (dx, dy) and rotation θ of each semiconductor die 334. While actual positions of semiconductor die 334 are described herein, for convenience, with respect to a center of the semiconductor die, a person of ordinary skill in the art will appreciate that any suitable portion or feature of the semiconductor die 334 may be used for measurement or calculation. Accordingly, FIG. 4A shows the measure of (dx, dy) reflects the translation between the semiconductor die center's nominal position 406 to the semiconductor die center's true position 408, while the angle θ shows the rotation.

The measured semiconductor die offsets (dx, dy) and rotations θ may be input to a software system 204 for processing. The software system 204 can calculate the radial shift $R_m$ for each semiconductor devices or package (e.g. 400, 410), which can be measured as the magnitude of the misalignment from the semiconductor die contact pattern (such as electrical interconnects 356 or semiconductor die-pads 342) to the BGA pads 394. Because rotation causes higher effective XY shift for features farther from the center 408 of the semiconductor die 334, the radial shift $R_m$ can be calculated at the feature farthest from the semiconductor die center 408, which for convenience can be referred to as the limiting feature 420, which is shown, e.g., in FIG. 4A. The limiting feature 420 will be at the limit of the displacement, or at a maximum displacement, because the radial shift $R_m$ at the limiting features will be the largest within the package 40, 410 for one or more of any measured X, Y, and θ misalignment. Thus, when the semiconductor die misalignment or radial shift $R_m$ is measured, the offset of the Cu stud pattern from the nominal (designed) pattern 402 to the true position 404 is determined (shown in FIG. 4A).

The software system 202 can distribute the total measured radial shift $R_m$ for a package 400, 410 across the allowable radial shifts $R_i$ in the adjacent layer pairs L of a design. The total measured radial shift $R_m$ can be measured at the limiting feature according to Equation 1 below.

$$R_m = \sqrt{S_x^2 + S_y^2}, \quad \text{Equation 1:}$$

where $R_m$ is the radial shift for the measured misalignment $(S_x, S_y)$ or the total measured radial shift. An x-coordinate of the measured misalignment $S_x = dx + (C_x \cos θ - C_y \sin θ) - C_x$, and a y-coordinate of the measured misalignment $S_y = dy + (C_x \sin θ + C_y \cos θ) - C_y$. $(C_x, C_y)$ is the position of the limiting feature relative to the measured XY position of the semiconductor die, (dx, dy) is the measured XY semiconductor die misalignment, and θ is the measured semiconductor die rotation. The terms $(C_x \cos Γ - C_y \sin θ)$ and $(C_x \sin θ + C_y \cos θ)$ represent a 2D rotation of the point $(C_x, C_y)$ around the semiconductor die center by θ.

Figure 5A:
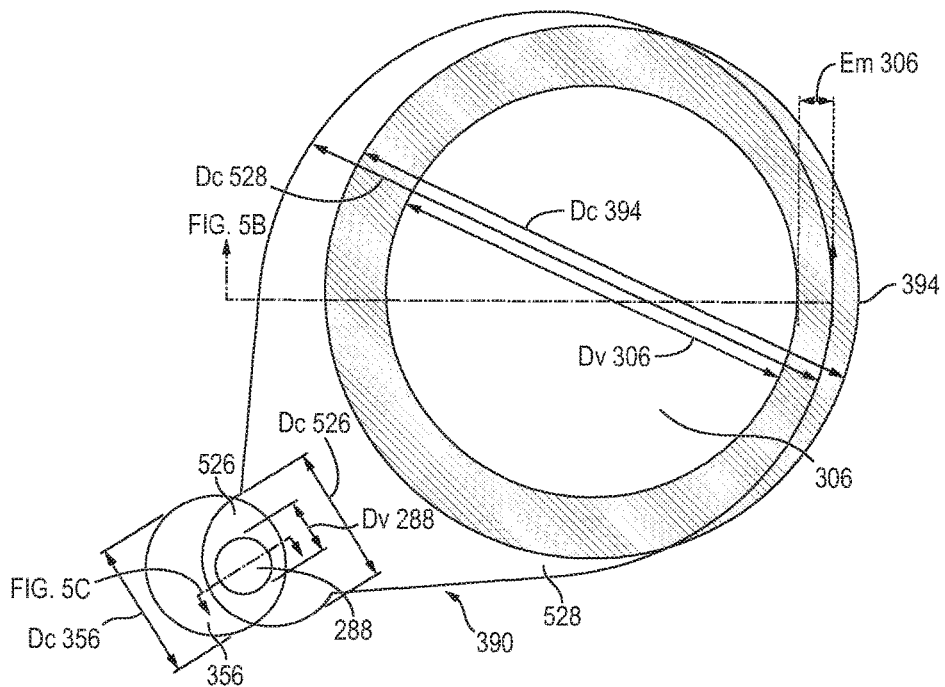
FIGS. 5A-5C illustrate non-limiting embodiments of portions of a build-up interconnect structure for a semiconductor device.
Figure 5B:
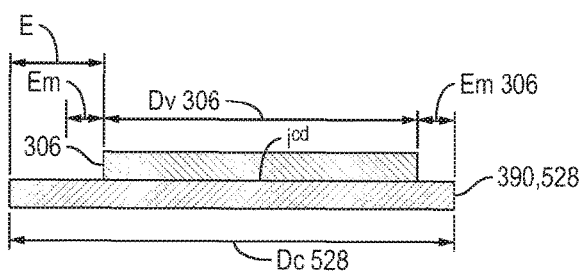
Figure 5C:
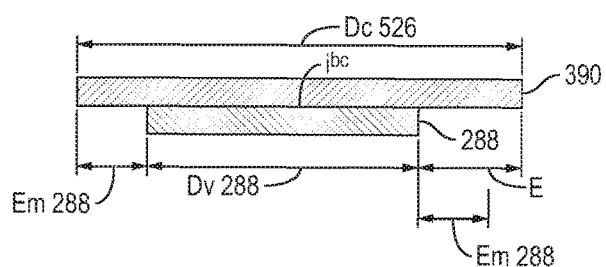

The total allowable radial shift $R_i$ for which unit specific progressive alignment can compensate is calculated from the layer interfaces or pad stacks i present in the design. In some embodiments, these interfaces can be vias, such as vias 288, 306 with an enclosing metal feature above and below, such as conductive interconnects 356, via capture pads or enclosing layers 526 and 528 of conductive layer or RDL 390, and UBM pad 394. Exemplary layered structures are shown, e.g., in package 410 shown in FIG. 3K, additional detail of which is shown in the close-up partial views shown in FIGS. 5A-5C, which are discussed in greater below. First, FIG. 5A shows a top or plan schematic view of overlapping features of the build-up interconnect structure 397 where the conductive via 288 is over the conductive interconnect or Cu stud 356, the first via capture pad or enclosing layer 526 of a RDL layer 390 is over via 288, an under-bump via 306 is over the second via capture pad or enclosing layer 528 of RDL 390, and a UBM 394 is over the under-bump via 306. FIGS. 5B and 5C show partial cross-section profile or side views of the layered structure shown in FIG. 5A, taken along the sections lines FIG. 5B and FIG. 5C, respectively. As shown in FIGS. 5B and 5C, a via layer may be over or under an enclosing layer, such as an RDL or capture pad, and the enclosing layer of the via may be larger than a minimum enclosure $E_m$ of the via to allow the interface i between the via and the enclosing layer to provide good electrical contact while taking into account movement or shift of the semiconductor die. More specifically, FIG. 5B shows via 306 over a portion of conductive layer 390, such as capture pad 528, which serves as an enclosing layer for via 306. Via 306 comprises a diameter $D_v 306$ that leaves an enclosure or enclosure area E that is greater than or equal to a minimum enclosure area Em for the capture pad 528, the via 306, or both. FIG. 5C shows via 288 below a portion of conductive layer 390, such as capture pad 526, which serves as an enclosing layer for via 288. Via 288 comprises a diameter $D_v 288$ that leaves a minimum enclosure area Em that is equal to or smaller than the enclosure or enclosure area E the capture pad 526, the via 288, or both.

While FIG. 3K shows a non-limiting example in which the package 410 comprises one RDL 390, and the additional detail of FIGS. 5A-5C is consistent therewith, in other instances there may be multiple vertically separated RDL layers, such as two or three vertically separated RDLs with vertical electrical interconnects or vias among the various RDL layers, each of which can add, and be, interface layers L, comprising interfaces i, that compensate for a portion of the distributed radial shift $R_d$.

As noted previously, manufacturing variations can cause positions of capture pads, such as capture pads 526, 528, to be offset from the actual position of the adjacent vias, such as vias 288, 306. In some instances, to alleviate electrical, mechanical, or reliability problems, the capture pads 526, 528 may be over-sized so that the vias 288, 306 remain enclosed by at least the minimum enclosure Em within the expected window of manufacturing variation. The total radial shift $R_m$ can be subdivided among various layers of the interconnects structure 397, such as layers, features, or elements 356, 288, 390, 306, and 394 shown in device or package 410 of FIG. 3K, which for convenience, have been labeled as layers a, b, c, d, and e, respectively. Various layers of the interconnects structure 397 are also shown and labeled for package or device 400 of FIG. 3J. The total radial shift $R_m$ can be subdivided among the various layers a, b, etc., into more than one, or a plurality of, total allowable radial shifts $R_i$ for each corresponding layer, so that the sum of the allowable radial shifts $R_i$ for each of the layers a, b, etc., is equal to the total radial shift $R_m$. As such, $R_i^{a,b}$ is the allowable radial shift between layer a and layer b, (or features 356 and 288) at interface $i_{a,b}$ as shown, e.g., in FIG. 3k. $R_i^{a,b}$ is calculated using Equation 2, presented below, with the dimensions illustrated in FIGS. 5B-5C. Multiple types of interfaces or pad-stacks i can be present between two layers. In all of the following description, the bottom-most layer (or the layer closest semiconductor die 334) contains the measured features to which the via makes contact.

$$R_i^{a,b} = \tfrac{1}{2}(D_c - D_v) - E_m, \quad \text{Equation 2:}$$

where $R_i^{a,b}$ is the allowable radial shift in interface i between layers a and b, $D_c$ is the diameter of the capture pad, $D_v$ is the diameter of the via; and $E_m$ is the minimum enclosure of the via by the capture pad.

The allowable radial shift between two layers is determined by the interface with the least allowable shift, as shown in Equation 3 below. The allowable shift between two layers can also be explicitly set to zero if desirable, for example to exactly align the under-bump vias 306 to the UBM layer 394.

$$R^{a,b} = \min\{R_i^{a,b} : i \in I\}, \quad \text{Equation 3:}$$

where $R^{a,b}$ is the allowable radial shift between layers a and b, $R_i^{a,b}$ is the allowable radial shift in interface i between layers a and b, and I is the set of types of interfaces or pad stacks i between layers a and b. Examples of types of interfaces or pad stacks include vias, such as vias 288, 306 with an enclosing metal feature disposed above, below, or both, such as conductive interconnects 356, via capture pads or enclosing layers 526 and 528 of conductive layer or RDL 390, and UBM pad 394.

The allowable radial shift for a design R, which accounts for all layers or a full set of layers, a, b, . . . , n, can then be determined according to Equation 4 below.

$$R = \Sigma_{a,b \in L_A} R^{a,b}, \quad \text{Equation 4:}$$

where R is the allowable radial shift for the design, $R^{a,b}$ is the allowable radial shift between layers a and b, and $L_A$ is the set of adjacent layer pairs L in the design (such as, e.g., (a, b), (b, c), (c, d), etc.), and where the layer pairs are denoted by L.

In some embodiments, all distribution strategies meet the constraints described in Equations 5 below.

$$R_d^{a,b} \leq R^{a,b},$$

$$\Sigma_{a,b \in L_A} R_d^{a,b} \leq R, \quad \text{Equations 5:}$$

where $R_d^{a,b}$ is the radial shift distributed to the interfaces between layers a and b, $R^{a,b}$ is the allowable radial shift between layers a and b, and $L_A$ is the set of adjacent layer pairs L in the design.

In some embodiments, the layer pairs L are ordered in priority or a priority list 205 and the most shift possible can be distributed to the layer pairs L having higher priorities. This means that the shift distributed to the first layer pair $L_1$ in the priority list 205 is at the maximum allowable amount before any radial shift $R_m$ is distributed to the second layer pair $L_2$ in the priority list 205 and so on. This strategy is beneficial when radial shift $R_m$ is more desirable in some layer pairs L than others.

First, a transformation ordinal, j, can be assigned to each layer pair such that $1 \leq j \leq |L_A|$, where $|L_A|$ is the number of adjacent layer pairs. The transformation ordinals can be the order in the priority list 205. The measured shift can be distributed to lower transformation ordinals first. Then the distributed radial shift for each pair of layers can be calculated using the recurrence relation in Equation 6, shown below.

$$R_d^{a,b} = R_j = \max\{0, \min\{R^{a,b}, R_m - \Sigma_{0 < k < j} R_k\}\}, \quad \text{Equation 6:}$$

where $R_d^{a,b} = R_j$ is the radial shift distributed to the interfaces between layers a and b and performed in the order indicated by j, $R^{a,b}$ is the allowable radial shift between layers a and b, and $R_m \leq R$ is the radial shift for the measured misalignment within the allowable radial shift for the design.

In some embodiments, the measured radial shift is distributed to each layer pair proportionate to the ratio of the allowable radial shift for that layer pair to the design's allowable shift. The shift distributed to each layer pair can be defined in Equation 7, presented below.

$$R_d^{a,b} = \left(\frac{R^{a,b}}{R}\right) R_m, \quad \text{Equation 7}$$

where $R_d^{a,b}$ is the radial shift distributed to the interfaces between layers a and b, $R^{a,b}$ is the allowable radial shift between layers a and b, R is the allowable radial shift for the design, and $R_m \leq R$ means that the radial shift for the measured misalignment is within the allowable radial shift for the design.

After the measured radial shift is distributed, as indicated at element 106 of FIG. 1 and in accordance with the equations presented above, the transformation for each layer is calculated as indicated at element 108 of FIG. 1. First, a fabrication ordinal, l, is assigned to each layer such that $0 < l \leq |L|$, where $|L|$ is the number of fabricated layers. The fabrication ordinals are assigned in the order of fabrication, satisfying the condition that: layer (l−1) is below layer l, and layer (l+1) is above layer l. Layer l=0 is the layer of measured features upon which the subsequent layers are fabricated, and so is not assigned a transformation. Equation 8, presented below, can then be used to calculate the translation and rotation for each layer. The origin of the first layer's transformation can be the true (measured) semiconductor die center 408.

$$(T_x^l, T_y^l) = \frac{R_d^{l-1,l}}{R_m}(dx, dy) + \Sigma_{0 < k < l}(T_x^k, T_y^k), \text{ and} \quad \text{Equation 8}$$

$$T_\theta^l = \frac{R_d^{l-1,l}}{R_m}\theta + \Sigma_{0 < k < l} T_\theta^k,$$

where $(T_x^l, T_y^l)$ is the translation component of the transformation for layer l, $T_\theta^l$ is the rotation component of the transformation for layer l, $R_d^{a,b}$ is the radial shift distributed to the interfaces between layers a and b, (dx, dy) is the measured XY semiconductor die misalignment, and θ is the measured semiconductor die rotation.

Next, the calculated transformation for each layer is applied to the design elements (traces, shapes, pads, etc.) within the layer, to enable the forming of unit specific patterns 399 over the semiconductor die 334 and panels 380, such as within the build-up interconnect structure 397, as indicated at element 110 in FIG. 1. For some elements, such as for saw streets, transformation that results in intersection or overlap with vias 288, 306 can be undesirable. To allow selective application of the transformation to design elements in each layer, the elements can be divided into multiple sets during design, such as into two sets during design. Elements in a first set may be transformed, and elements in the second set will not be transformed and will be left at their nominally designed positions. Thus, the transformed and non-transformed sets can allow, for example, the saw streets 336 in insulating layer 280 or 304, such as a via polymer layer, to remain aligned to the package edge 337 (or nominal position), while the via openings are transformed to make contact to the layer below (according to the distributed radial shift). This method can also allow elements such as the under-bump vias 306 and under-bump metal pads 394 to remain aligned to the package edge (nominal position), while other features in the same layer are transformed. The transformed and non-transformed design elements for each layer can then be output into the unique unit specific patterns 399 for each semiconductor package or device 400, 410. Finally, the unique unit specific patterns 399 for each semiconductor package or device 400, 410 can be supplied to a lithography system 206 for patterning.

Figure 6:
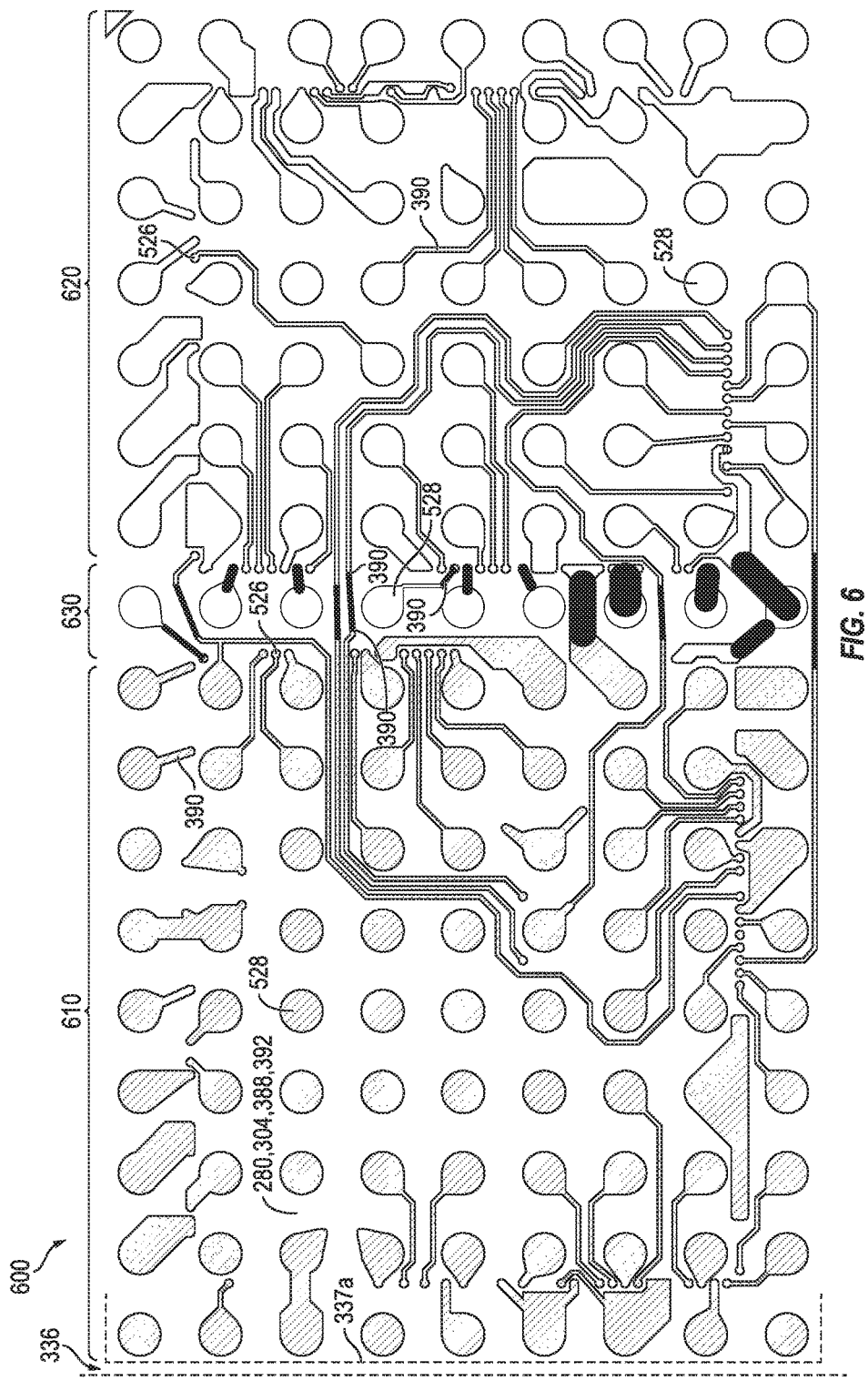
FIG. 6 illustrates a layer of a build-up interconnect structure of a semiconductor device comprising multiple partitions.

In some embodiments, compensation or arrangement can be made for misalignment of multiple semiconductor die 334 within a single semiconductor device or package 600, as shown in the top or plan view of FIG. 6. FIG. 6 shows design features for package 600, which can be generally similar to those of semiconductor package 410, but comprising two or more semiconductor die 334 within the package 600, whereas other features are similarly arranged and named. As such, the layer shown in FIG. 6 can be analogous to layer c of packages 400, 410, but be additionally partitioned into multiple partitions 610, 620, and 630, wherein the allowable radial shift $R_m$ in the interfaces i can be separately calculated for each partition 610, 620, and 630. Additionally, for the case of packages 600 comprising multiple semiconductor die 334, the distributed radial shift $R_d$, and each of the steps 104-110 of FIG. 1 described above with respect to the various equations can also be separately applied for each of the multiple partitions 610, 620, and 630.

In some embodiments, a first number of layers, such as a first n layers of the design, may be split into multiple partitions, while the subsequent layers are not partitioned. The subsequent layers can have $R^{a,b}=0$, or the subsequent layers can be aligned to the average of multiple partitions below.

An exemplary sequence presented below illustrates results from the application of unit specific progressive alignment with respect to the layered structure illustrated in FIG. 5A, where the structure comprises conductive interconnect, such as a Cu stud 356 (layer a), a via 288 (layer b), an RDL 390 (layer c), a via 306 (layer d), and a UBM 394 (layer e). The via 288 is over electrical interconnect 356, the first or via capture pad 526 of a RDL layer 390 is over via 288, a under-bump via 306 is over the second via capture pad 528 of the RDL layer 390, and a UBM 394 is over the under-bump via 306. A radial shift distribution strategy distributes the shift of the semiconductor dies 334 from its nominal position 406 to the actual position 408 to the various desired layers a, b, etc. of the device 400, 410 in order of fabrication (e.g., according to Equation 8). The measured radial shift $R_m$ for this example is, for illustration, equal to the maximum allowable radial shift for the design, R. In addition, the allowable radial shift R in the UBM 394 relative to the under bump via 306 may be set to zero: $R^{d,e}=0$. After the embedded die panel 380 is fabricated, the true position of each semiconductor die 334 can be measured. The software system 204 can convert the measured (dx, dy) and rotation θ into a radial shift value $R_m$.

Layer b, comprising vias 288, may be translated by $(T_x^b, T_y^b)$ and rotated by $T_\theta^b$ (for the first via layer 288, l=b in Equation 8), and be fabricated over the Cu stud pattern 356. Since the measured radial shift, $R_m$, is greater than the allowable shift between the Cu stud layer 356 and the via layer 288, the shift distributed to interface between the Cu stud 356 and via layer 288 is maximized to $R_d^{a,b}=R^{a,b}$ (see Equations 5 and 6). The subsequent layers account for the remaining radial shift, $R_m-R_d^{a,b}$. The constraints ensure that, after transformation of the via layer 288, all design elements still meet the minimum enclosure rules to account for manufacturing variances. The translated and rotated via layer 288 is fabricated over the Cu stud pattern 356.

The next layer, RDL layer 390 translated by $(T_x^c, T_y^c)$ and rotated by $T_\theta^c$ (l=c in Equation 8), is fabricated over the via pattern 288. Since the remaining measured radial shift, $R_m-R_d^{b,c}$, is greater than the allowable shift between the via layer 288 and the RDL 390, the shift distributed to the interface between the via layer 288 and the RDL 390 is maximized to $R_d^{b,c}=R^{b,c}$ (see Equations 5 and 6). The subsequent layers account for the remaining radial shift, $R_m-R_d^{a,b}-R_d^{b,c}$. The translated and rotated RDL layer 390 is fabricated over the via layer 288 pattern.

The next layer, the under-bump via layer 306 translated by $(T_x^d, T_y^d)$ and rotated by $T_\theta^d$ (l=d in Equation 8), is fabricated over the RDL 390 pattern. Since the remaining measured radial shift is equal to or less than the allowable shift in the interface between the RDL 390 and the under-bump via layer 306, the shift distributed is $R_d^{c,d}=R_m-R_d^{a,b}-R_d^{b,c}$ (using the strategy described above, such as that depicted in Equations 5 and 6). The UBM layer 394 (l=d in Equation 8) is not translated or rotated relative to the under-bump via layer 306 because $R^{c,d}=0$ for this design. The translated and rotated under-bump via layer 306 is fabricated over the RDL layer 390, the UBM 394 being fabricated over the under-bump via layer 306 without transformation.

In accordance with various embodiments described herein, a sample or lot of packages, such as packages 400, 410, 430, or 600 may be singulated from a reconstituted wafer or embedded die panel 380, as shown for example in FIG. 3I. The sample may be characterized by a statistical distribution of alignments for each of the semiconductor die 334 relative to the final patterned layer, such as UBM 394, or package edge 337. The sample may also be characterized by the statistical distributions of the relative misalignment of each patterned layer, such as any of layers a, b, . . . , n, (or any of the adjacent layers $L_{A_i}$) to the previous layer. In a conventional process, the sum of the variances of relative layer-to-layer misalignments (such as for a set of all adjacent layers $L_{A_i}$) is not substantially equal to the misalignment of the die 334 to the final layer 394 or package edge 337.

In accordance with various embodiments described herein, the statistical variance of the alignment between the semiconductor die 334 and the first patterned layer, such as layer a or layer b, plus the sum of the variances of the alignment of each successive patterned layer to the previous patterned layer is substantially equivalent to the variance of the alignment of the semiconductor die 334 to the final patterned layer 394 or package edge 337, as described mathematically below in equation 9.

Var(misalignment(die, $L_1$))+$\Sigma_{i=2}^n$Var(misalignment $(L_{i-1}, L_i)$)≈Var(misalignment(die, $L_n$)), and Var(misalignment(die, $L_1$))<<Var(misalignment(die, $L_n$))   Equation 9:

Where $L_i$ is the i-th patterned layer, n is the total number of layers, and misalignment (a, b) is the magnitude of the misalignment between layers a and b.

The semiconductor package, such as 400, 410, 430, or 600, may contain one or more insulating, dielectric layers or polymer layer, such as layers 280, 304, 388, or 392, which may have an opening, space, gap, or channel in the dielectric or polymer layer that extends along the saw street 336 at the package edge 337. The edge 337a of the insulating, dielectric layers or polymer layer such as layers 280, 304, 388, or 392, shown e.g., in FIGS. 3K and 6, show that the edge 337 can align, follow, or further define the saw street 336, such as in instances where the singulation device, saw blade, or laser cutting tool 398 may use the edge 337a of the insulating, dielectric layers or polymer layer such as layers 280, 304, 388, or 392, to singulate the embedded die panel 380. As such, in order to maintain consistent alignment, and reduce or eliminate variance for the edges 337a to the package edge 337 for the saw street 336, or the semiconductor die 334, the variance between the edges 337a may be substantially different from the variance of the other features within the layer 280, 304, 388, or 392 (such as vias 288, 306, conductive interconnects 356, via capture pads or enclosing layers 526 and 528 of conductive layer or RDL 390, and UBM pad 394). Stated another way, in some instances, an edge 337a of at least one dielectric layer, and in some instances all the edges 337a of all the insulating, dielectric, or polymer layers, such as layers 280, 304, 388, or 392, will be aligned to the package edge 337 or saw street 336, while other features formed or contained within the layers, such as vias 288, 306, conductive interconnects 356, via capture pads or enclosing layers 526 and 528 of conductive layer or RDL 390, and UBM pad 394) will have more variance with respect to alignment to the package edge 337.

As such, forming a semiconductor die package 400, 410, 430, 600, or other FOWLP as described herein, can be advantageous for at least the reasons set forth herein. For example, the true position of the one or more devices or semiconductor die 334 in the embedded die panel 380 can be measured after fabrication of the panel 380, the radial shift $R_m$ can be measured and the total allowable radial shift R can be calculated or ascertained, the radial shift or misalignment $R_m$ can then be distributed across multiple layers, unique patterns can be generated for each layer of each package to compensate for the semiconductor die misalignment, and the unique patterns can then be applied to the packages. The radial shift can be distributed across multiple layers such that the shift for each layer is less than the allowable shift calculated from the dimensions of the layer-to-layer interfaces. The radial shift can be distributed $R_d$ across multiple layers of the semiconductor device 400, 410, 430, 600, using a strategy wherein the shift is distributed based on a prioritization of layers as included in the priority list 205, and the highest priority layer is assigned the maximum possible shift before the next highest priority layer is assigned its shift or maximum possible shift.

The measured radial shift can be distributed to each layer proportionate to the ratio of that layer's allowable radial shift to the total allowable radial shift in the design. A transformation (translation and rotation) can be generated for each layer derived from the assigned portion of the measured radial shift, where the transformation is relative to the layer below. The transformation can be selectively applied to some features (e.g., traces, shapes, pads, vias) in each layer and not to some others, thus leaving some design features in each layer aligned to the package edge if desirable. The interfaces i between layers can be designed to have enclosure E greater than the minimum necessary enclosure $E_m$ for manufacturing, while still minimizing the impact on any single layer because the method uses multiple interfaces to compensate for semiconductor die misalignment. The set of design features (including layer-to-layer interfaces) in a layer can be divided into multiple partitions, the allowable radial shift within each partition (for example, each partition corresponding to several semiconductor die 334 in the package 600) can be separately calculated, and then a separately calculated transformation to the design features in each partition can be separately applied. Additionally, Adaptive Routing™ can be used to connect the design features across the partition boundaries. Unit specific progressive alignment can be used with multiple partitions on the first and optionally one or more subsequent layers (such as an RDL, under-bump via layer, or UBM) to compensate for the semiconductor die misalignment.

Additionally, using the methods and processes described herein, unit specific progressive patterning for fan-out packaging can be used to compensate for large semiconductor die misalignment without significant changes to any single layer's nominal design. This method gives a designer flexibility on where in the layer stack or within the build-up interconnect structure 397 to compensate for semiconductor die shift because increasing enclosure by enlarging features or shrinking vias may be allowable on some layers, but undesirable on others. Total allowable radial shift R can increase since more than one layer interface is used to compensate for semiconductor die shift. Saw streets 336 can be aligned to the package edge 337, which can prevent saw incursion into the package or misalignment of the saw 398 to the saw street 336 across the panel 380. The BGA and under-bump vias 306 can be aligned to the package edge 337 while other features are transformed to compensate for misalignment. Additionally, using multiple partitions 610, 620, 630 to allow a smaller semiconductor die 334 to have a greater allowable shift R while a larger semiconductor die 334 has a lower allowable shift R and denser patterning can benefit certain designs.

The benefits and advantages outlined herein are applicable to fan-out packaging in general, as well as any process or structure where lithography layers are built-up over an embedded component, such as embedded semiconductor die in PCBs or embedded multi-die interconnect bridge (EMIB).

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

What is claimed is:

1. A method of making a semiconductor device, comprising:
    measuring a true position of each of a plurality of semiconductor die within an embedded die panel;
    determining a total radial shift of each of the plurality of semiconductor die;
    distributing the total radial shift of each of the plurality of semiconductor die to two or more layers for each of the plurality of semiconductor die by assigning a portion of the total radial shift to each of the layers according to a priority list to form a distributed radial shift for each of the layers;
    calculating a transformation for each of the layers for each of the plurality of semiconductor die using the distributed radial shift for each of the layers; and
    forming a unit specific pattern over each of the plurality of semiconductor die, the unit specific pattern comprising the transformation for each of the layers,
    wherein determining a total radial shift of each of the plurality of semiconductor die further comprises the total radial shift of each of the plurality of semiconductor die being calculated at a limiting feature relative to a semiconductor die center of each of the plurality of semiconductor die.

2. The method of claim 1, wherein the limiting feature is a feature on each of the plurality of semiconductor die farthest from the semiconductor die center of each of the plurality of semiconductor die.

3. The method of claim 1, wherein forming the unit specific pattern comprises forming a lithography pattern, and applying the lithography pattern over each of the plurality of semiconductor within the embedded die panel.

4. The method of claim 1, wherein a distributed amount of the total radial shift for one or more layers having a high priority in the priority list is maximized to an amount allowed by an allowable radial shift for each of the one or more layers, and a sum of the distributed amount totaled over the two or more layers for each of the plurality of semiconductor die is less than a total allowable radial shift.

5. The method of claim 1, wherein the total radial shift is distributed across the layers proportional to a fraction of an allowable radial shift for each of the layers over a total allowable radial shift.

6. The method of claim 1, wherein forming a unit specific pattern over each of the plurality of semiconductor die further comprises:
dividing design elements in each of the layers into at least two sets, wherein a distributed amount of the total radial shift for each of the design elements in a first set of the sets is set as zero; and
generating the unit specific pattern for each of the layers using the distributed amount of the total radial shift for the each design element in each of the layers.

7. The method of claim 6, wherein:
the design elements in the first set comprise at least one of a saw street, an under-bump via, and an under-bump metal pad; and
wherein calculating the transformation further comprises calculating a translation and a rotation.

8. The method of claim 1, wherein the embedded die panel comprises two or more partitions, each partition comprises one or more semiconductor die, and the measuring, determining, distributing, and calculating occur separately for each of the two or more partitions.

9. A method of making a semiconductor device, comprising:
determining a true position of a semiconductor die within an embedded die panel;
determining a total radial shift of the semiconductor die;
distributing the total radial shift of the semiconductor die to two or more layers of a unit specific pattern according to a priority list to form a distributed radial shift for each of the layers;
calculating transformation components for each of the layers of the unit specific pattern according to the distributed radial shift for each of the layers; and
forming the layers of the unit specific pattern over the semiconductor die,
wherein the total radial shift is distributed across one or more of the layers proportional to a fraction of an allowable radial shift for each of the layers over a total allowable radial shift.

10. The method of claim 9, wherein determining a total radial shift of the semiconductor die further comprises the total radial shift of the semiconductor die being calculated at a limiting feature relative to a semiconductor die center of the semiconductor die, and the limiting feature is a feature on the semiconductor die farthest from the semiconductor die center of the semiconductor die.

11. The method of claim 9, wherein a distributed amount of the total radial shift for one or more layers having a high priority in the priority list is maximized to an amount allowed by an allowable radial shift for the one or more layers.

12. The method of claim 9, wherein forming the layers of the unit specific pattern over the semiconductor die further comprises:
dividing design elements in each layer into at least two sets, wherein a distributed amount of the total radial shift for each of the design elements in a first set of the sets is set as zero; and
generating the unit specific pattern for each of the layers using the distributed amount of the total radial shift for the each design element in each of the layers.

13. The method of claim 12, wherein the design elements in the first set comprises at least one of a saw street, an under-bump via, and an under-bump metal pad.

14. A method of making a semiconductor device, comprising:
determining a true position of a semiconductor die within an embedded die panel;
determining a total radial shift of the semiconductor die, wherein determining a total radial shift of the semiconductor die further comprises the total radial shift of the semiconductor die being calculated at a limiting feature relative to a semiconductor die center of the semiconductor die, and the limiting feature is a feature on the semiconductor die farthest from the semiconductor die center of the semiconductor die;
distributing the total radial shift of the semiconductor die to two or more layers of a pattern to form a distributed radial shift; and
forming the layers of the pattern over the semiconductor die;
wherein a distributed amount of the total radial shift for one or more layers having a high priority in a priority list is maximized to an amount allowed by an allowable radial shift for the one or more layers,
wherein the total radial shift is distributed across one or more of the layers proportional to a fraction of an allowable radial shift for each of the layers over a total allowable radial shift.

15. The method of claim 14, wherein forming the layers of the pattern over the semiconductor die further comprises:
dividing design elements in each layer into at least two sets, wherein a distributed amount of the total radial shift for each of the design elements in a first set of the sets is set as zero; and
generating a unit specific pattern for each of the layers using the distributed amount of the total radial shift for the each design element in each of the layers.

16. The method of claim 15, wherein the design elements in the first set comprises at least one of a saw street, an under-bump via, and an under-bump metal pad.

* * * * *